US012259285B2

(12) United States Patent
Reitsma et al.

(10) Patent No.: US 12,259,285 B2
(45) Date of Patent: Mar. 25, 2025

(54) PACKAGE STRESS SENSOR

(71) Applicant: Analog Devices, Inc., Wilmington, MA (US)

(72) Inventors: George Pieter Reitsma, Redwood City, CA (US); Kalin V. Lazarov, Colorado Springs, CO (US)

(73) Assignee: Analog Devices, Inc., Wilmington, MA (US)

( * ) Notice: Subject to any disclaimer, the term of this patent is extended or adjusted under 35 U.S.C. 154(b) by 351 days.

(21) Appl. No.: 17/816,979

(22) Filed: Aug. 2, 2022

(65) Prior Publication Data

US 2023/0049755 A1 Feb. 16, 2023

Related U.S. Application Data

(60) Provisional application No. 63/233,096, filed on Aug. 13, 2021.

(51) Int. Cl.
*G01L 1/00* (2006.01)
*G01R 19/10* (2006.01)

(52) U.S. Cl.
CPC .............. *G01L 1/005* (2013.01); *G01R 19/10* (2013.01)

(58) Field of Classification Search
None
See application file for complete search history.

(56) References Cited

U.S. PATENT DOCUMENTS

| 5,499,526 A | 3/1996 | Muro |
| 5,619,163 A | 4/1997 | Koo |
| 6,008,685 A | 12/1999 | Kunst |
| 6,362,618 B1 | 3/2002 | Motz |
| 6,847,319 B1 | 1/2005 | Stockstad |
| 7,225,099 B1 | 5/2007 | O'dwyer |
| 7,342,390 B2 | 3/2008 | Tachibana et al. |

(Continued)

FOREIGN PATENT DOCUMENTS

| CH | 704694 A1 | 9/2012 |
| CN | 102636761 A | 8/2012 |

(Continued)

OTHER PUBLICATIONS

De Cesare G, et al., "A novel a-Si:H mechanical stress sensor", Thin Solid Films 427, Elsevier, (191-195), 2003.

(Continued)

*Primary Examiner* — Peter J Macchiarolo
*Assistant Examiner* — Jermaine L Jenkins
(74) *Attorney, Agent, or Firm* — Schwegman Lundberg & Woessner, P.A.

(57) ABSTRACT

A semiconductor-based stress sensor can include a bipolar transistor device with first and second collector terminals. An excitation circuit can provide an excitation signal to an emitter terminal of the bipolar transistor device, and a physical stress indicator for the semiconductor can be provided based on a relationship between signals measured at the collector terminals in response to the excitation signal. The signals can indicate a charge carrier mobility characteristic of the semiconductor, which can be used to provide an indication of physical stress. In an example, the physical stress indicator is based on a current deflection characteristic of a base region of the transistor device.

21 Claims, 13 Drawing Sheets

(56) References Cited

U.S. PATENT DOCUMENTS

| | | |
|---|---|---|
| 7,750,743 B2 | 7/2010 | Ausserlechner et al. |
| 7,980,138 B2 | 7/2011 | Ausserlechner |
| 8,390,363 B2 | 3/2013 | Engl |
| 9,016,135 B2 | 4/2015 | Huber et al. |
| 9,389,126 B2 | 7/2016 | Kim et al. |
| 9,748,969 B1 | 8/2017 | Bach et al. |
| 9,804,036 B2 | 10/2017 | Ma |
| 9,846,204 B2 | 12/2017 | Huber et al. |
| 9,910,087 B2 | 3/2018 | Eagen et al. |
| 10,078,022 B2 | 9/2018 | Ausserlechner |
| 10,228,294 B2 | 3/2019 | Bach et al. |
| 10,250,233 B2 | 4/2019 | Scilla |
| 10,254,354 B2 | 4/2019 | Cesaretti |
| 10,333,463 B2 | 6/2019 | Motz |
| 10,386,250 B2 | 8/2019 | Ausserlechner et al. |
| 10,408,692 B2 | 9/2019 | Miyajima |
| 10,564,055 B2 | 2/2020 | Ausserlechner |
| 10,607,901 B2 | 3/2020 | Hiblot et al. |
| 10,704,969 B2 | 7/2020 | Zanchi |
| 10,712,400 B2 | 7/2020 | Motz et al. |
| 10,809,752 B2 | 10/2020 | Hurwitz et al. |
| 10,879,920 B2 | 12/2020 | Kassovski et al. |
| 10,969,444 B2 | 4/2021 | Motz |
| 2004/0091759 A1* | 5/2004 | Harrington .......... G01R 31/389 714/48 |
| 2015/0142342 A1 | 5/2015 | Huber et al. |
| 2021/0082352 A1 | 3/2021 | Lee et al. |
| 2023/0046102 A1 | 2/2023 | Reitsma et al. |

FOREIGN PATENT DOCUMENTS

| | | |
|---|---|---|
| CN | 104422474 A | 3/2015 |
| CN | 110501031 A | 11/2019 |
| CN | 115704722 | 2/2023 |
| CN | 115931184 | 4/2023 |
| DE | 10154498 A1 | 5/2003 |
| DE | 102022120380 | 2/2023 |
| DE | 102022120381 | 2/2023 |
| EP | 1828733 A1 | 9/2007 |
| EP | 1792152 B1 | 3/2010 |
| EP | 2203756 B1 | 4/2011 |
| JP | 3007976 B2 | 2/2000 |
| RU | 2239916 C1 | 11/2004 |

OTHER PUBLICATIONS

Gieschke, P., et al., "CMOS-Based Piezo-FET Stress Sensors in Wheatstone Bridge Configuration", IEEE Sensors, Limerick, IE, (Oct. 2011), 4 pgs.

Sutor, Alexander, et al., "New CMOS-Compatible Mechanical Shear Stress Sensor", IEEE Sensors Journal, 1(4), (Dec. 2001), 345-351.

"Chinese Application Serial No. 202210965066.9, Office Action mailed Dec. 31, 2024", w/ English machine translation, 9 pgs.

U.S. Appl. No. 17/816,947, filed Aug. 2, 2022.

* cited by examiner

PACKAGE STRESS SENSOR

CROSS-REFERENCE TO RELATED APPLICATIONS

This patent application claims the benefit of priority of U.S. Provisional Patent Application Ser. No. 63/233,096, entitled "PACKAGE STRESS SENSOR," filed on Aug. 13, 2021, which is hereby incorporated herein by reference in its entirety.

BACKGROUND

Semiconductors can be subject to mechanical stress, such as due to environmental influences like temperature or humidity. Stress, or changes in stress, can influence semiconductor device performance or sensitivity.

The Hall effect refers to a voltage difference that can be generated across an electric conductor in the presence of a magnetic field. A direction of the generated voltage can be transverse to an electric current in the conductor and to the magnetic field perpendicular to the current. A Hall sensor is a magnetic field sensor that is based on the Hall effect.

In an example, a Hall sensor can provide an electrical output signal that is proportional to a component of a magnetic field that influences the sensor. The Hall sensor can include a Hall element or group of elements and a processor to receive and interpret signals from the element or elements. In an example, a Hall sensor comprises an integrated circuit packaged in a housing, and the sensor or its packaging can be subject to mechanical stress. When a Hall sensor is used to characterize a magnetic field, it can be desirable to cancel the effects of mechanical stress on the sensor itself. Likewise, when a stress sensor is used to characterize stress or a change in stress, it can be desirable to cancel any Hall effects that may influence or corrupt the stress indicator.

BRIEF SUMMARY

The present inventors have recognized, among other things, that a problem to be solved includes determining an appropriate compensation for package stress on packaged integrated circuits. The present inventors have recognized that a solution can include or use a sensor that is configured to measure mechanical stress while concurrently mitigating the effects of magnetic fields that could otherwise corrupt a stress measurement. The solution can include characterizing a stress direction and stress magnitude. Information about the stress direction and magnitude can in turn be used together with other circuitry to counteract the influence of stress on other circuit elements or performance parameters. For example, information about the stress direction and magnitude can be used to counteract an error term in a voltage or current signal reference generator, or to calibrate an offset for a converter circuit.

In an example, the solution can include or use a semiconductor Hall plate-based sensor configured to provide information about package stress. In an example, the sensor can include a Hall plate and an excitation circuit. The excitation circuit can provide signals to respective node pairs of the Hall plate. A measurement circuit can receive information about a first electric signal at a first pair of nodes in response to a first portion of the excitation signal, and can receive information about a second electric signal at a second pair of nodes in response to a second portion of the excitation signal. The first and second electric signals can indicate a charge carrier mobility characteristic of the semiconductor, which can be used to provide an indication of physical stress on the sensor.

In an example, the solution can include or use a semiconductor-based stress sensor comprising a bipolar transistor device with multiple (e.g., first and second) collector terminals. An excitation circuit can provide an excitation signal to a base-emitter junction of the bipolar transistor device, and a physical stress indicator for the semiconductor can be provided based on a relationship between signals measured at the collector terminals in response to the excitation signal. In an example, the physical stress indicator can be based on a current deflection characteristic of a base region of the transistor device.

This summary is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
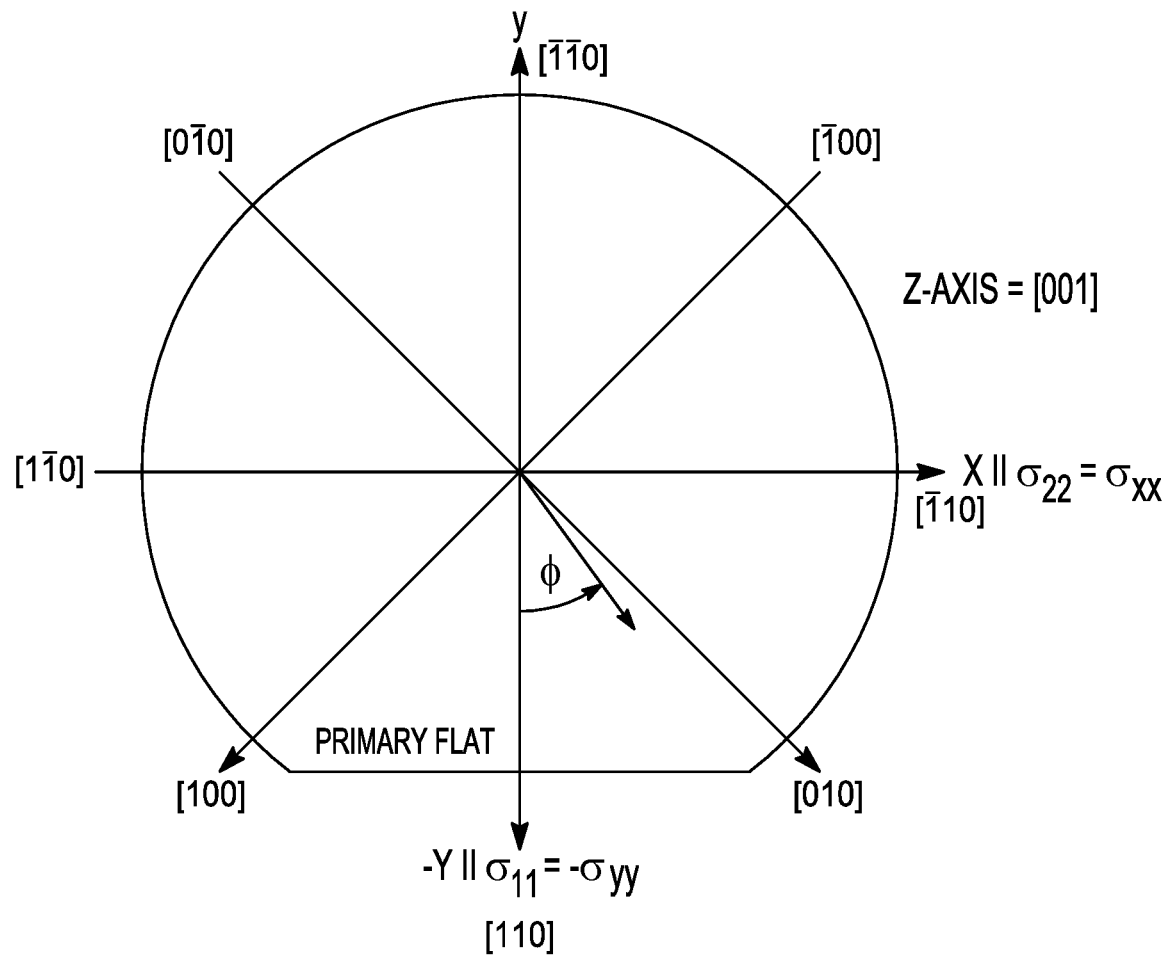
FIG. 1 illustrates generally an example of a semiconductor wafer and its crystal planes.

Integrated circuits (ICs) can be mounted or packaged to help protect sensitive integrated circuitry from stress or environmental influences. However, such packaging or mounting can be a source of mechanical stress on the semiconductor material that comprises an IC. Mechanical stress can influence or change circuit behavior, for example, because it can change the mobility and scatter factor of charge carriers (e.g., electrons or holes). Such changes can contribute to drift or offset in parameters such as resistance, magnetic sensitivity, transistor behavior, or piezo-related effects. In some examples, mechanical stress can change over time due to external environmental influences or can change due to longer-term drift and material aging.

For compensation of package stress, a stress sensor can be configured to sense the stress experienced by devices on a particular chip or substrate. In an example, transistors or bulk resistors can be used to sense stress by measuring a change in electron mobility (e.g., for n-type materials) or hole mobility (e.g., for p-type materials). However, such devices can be sensitive to the presence of magnetic fields, which can introduce errors in stress measurements. In other words, the Lorentz force can cause deflection of current flow in a sensor, such as in the presence of magnetic fields. Furthermore, some stress sensors are not configured to sense a direction of the stress. The present inventors have recognized solutions to these and other problems.

The present inventors have recognized that a solution to the stress measurement problem can include or use a sensor that is configured to measure mechanical stress while concurrently mitigating the effects of magnetic fields that could otherwise corrupt the stress measurement. The solution can include characterizing a stress direction and stress magnitude. Information about the stress direction and magnitude can in turn be used together with other circuitry to counteract the influence of stress on other circuit elements or performance parameters. For example, information about the stress direction and magnitude can be used to counteract an error term in a voltage or current signal reference generator, or to calibrate an offset for a converter circuit.

In an example, the solution can include or use a Hall plate. Using the results of multiple measurements, circuitry can be used to cancel error due to magnetic fields, or to estimate sensitivity or drift, or to provide corresponding stress-compensation signals. In an example, the solution can include or use multiple semiconductor layers, such as comprising a bipolar transistor with multiple collectors (or one collector that is bifurcated, or is further separated, to separate terminals). Information about the respective current densities in the different collectors can be used to characterize a direction or magnitude of stress in the package comprising the transistor. In some examples, the transistor can comprise a portion of a reference generator circuit or can be used to provide an offset signal to correct a different reference generator circuit.

The various solutions discussed herein offer various advantages over prior stress sensors. For example, compared to measuring an absolute mobility as a resistance or transistor current, using off-diagonal measurements of mobility components in a Hall plate can provide more information about the magnitude and direction of stress components. Furthermore, a first order temperature compensation can be achieved by taking the ratio of the off-diagonal component and absolute resistance. Further still, an influence of nearby magnetic fields can be compensated using two measurements to cancel the Hall effect voltage.

FIG. 1 illustrates generally an example of Miller indices for a crystal structure. A semiconductor wafer, such as including silicon, can be cut from a silicon crystal rod such that the wafer surface coincides with a crystallographic plane. FIG. 1 shows a plan view of such a semiconductor wafer cut in the plane designated [100], and including a "Primary Flat" indicating the particular crystal orientation. Some wafers include a secondary flat to indicate a doping of the wafer (e.g., as n-type or p-type). The principal crystallographic directions in the wafer plane are identified in FIG. 1. In an example, circuit structures can be built on a wafer with the circuit side edges or walls extended parallel or perpendicular to the wafer flat.

By convention using the Miller indices, the plane [110] extends perpendicular to the primary flat, and the plane [$\bar{1}$10] extends parallel to the primary flat. The plane [010] extends at an angle of +45° and the plane [100] extends at an angle of −45° relative to the [110] direction.

In the example of FIG. 1, an angle $\phi$ is defined with respect to the [110] plane. Circuit structures built on the [100] wafer are generally positioned such that vertical structures extend in the direction of $\phi=0°$ and horizontal structures extend in the direction of $\phi=90°$. In this orientation, the primary flat can be considered parallel to the x-axis, and edges of the chip (or circuit structures) are generally parallel to the x and y axes. In this example, the crystal planes [100] and [010] correspond to the diagonal directions of the structures.

Generally, silicon crystal having a [100] configuration is widely available and often used in the manufacture of integrated circuit devices. Accordingly, the following discussion assumes [100] type material is used unless specifically indicated otherwise. However, those skilled in the art will appreciate that other materials can similarly be used.

Conventional stress sensors, such as comprising a resistive bridge, can be subject to the influence of magnetic fields that can cause errors in a measured stress signal. The present inventors have recognized that a better way to measure stress can include or use a Hall plate, such as can include a generally symmetric crystalline structure with multiple signal contacts or nodes. Different pairs of nodes can be excited or biased by respective signals and response signals can be measured from respective different pairs of nodes. The response signals can be analyzed together to determine a mobility or deflection characteristic of electrons (or holes) in the Hall plate. Using the determined deflection characteristics, more accurate information about package stress can be determined while simultaneously canceling the impact of any Hall effect, or influence of any magnetic field.

In an example, a Hall plate comprises a doped semiconductor device having a particular width, length, and thickness. A conventional Hall plate is generally rectangular or square and includes two pairs of contacts or nodes: one pair is used for biasing, and the other is used for sensing or measuring. The nodes are provided at the corners of the rectangular plate. Generally, a Hall plate is symmetrical about each of the axes connecting the respective pairs of nodes. Hall plates can have other, non-rectangular shapes, such as crosses, hexagons, or others that exhibit symmetry along multiple axes.

Figure 2A:
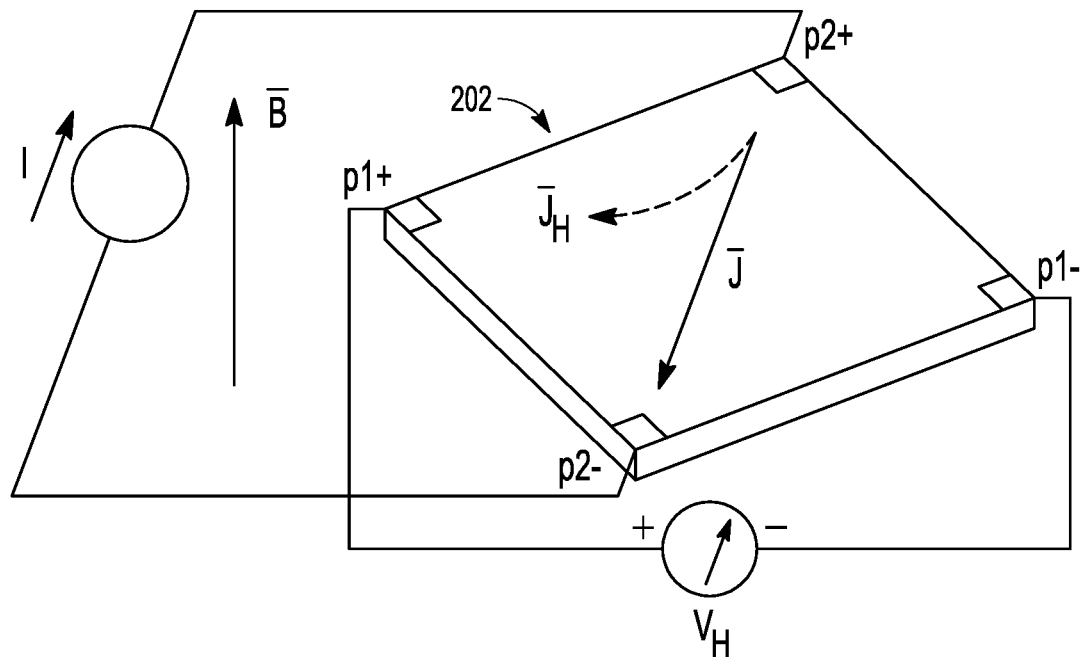
FIG. 2A and FIG. 2B illustrate generally examples of a rectangular Hall plate.
Figure 2B:
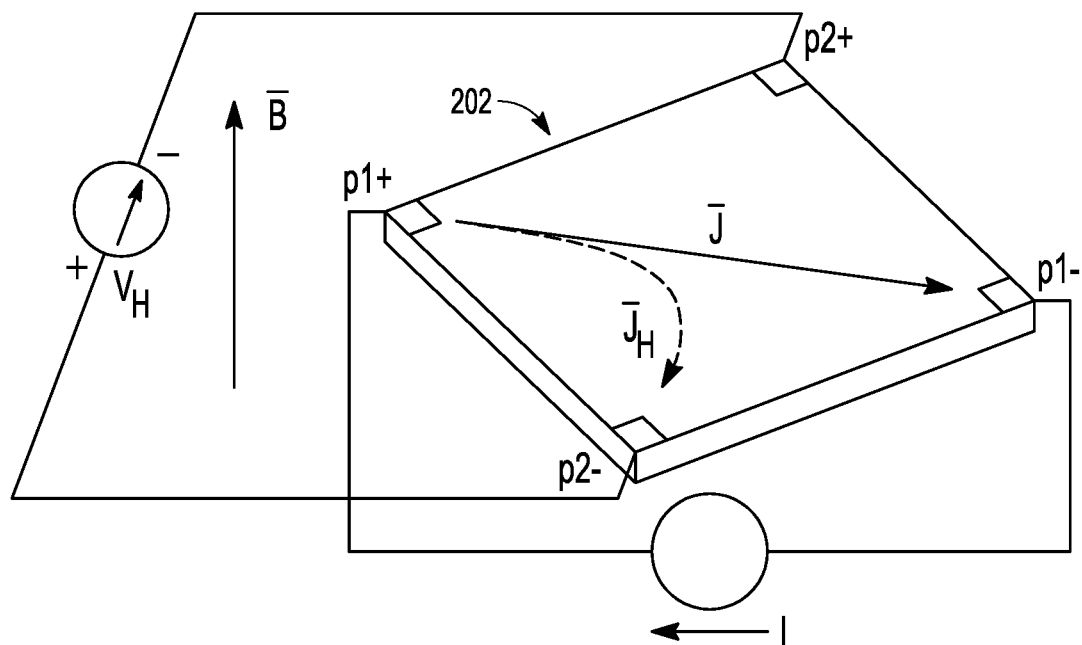

FIG. 2A and FIG. 2B illustrate generally examples of a rectangular first Hall plate 202. The first Hall plate 202 can comprise a crystalline structure, such as can include an epitaxial layer that can be grown or deposited on a substrate such as silicon. Generally, the first Hall plate 202 can include one or more layers formed with a well-defined orientation relative to an orientation of the substrate or seed layer.

In an example and independent of mechanical stress effects, an effect of a magnetic field on a Hall plate can be modeled as a bridge. For example, in non-stressed silicon, a Hall voltage measured across a Hall plate can be a function of the bias current applied to the plate and resistive characteristics of the plate.

To illustrate, FIG. 2A and FIG. 2B show examples of the rectangular first Hall plate 202 under different bias conditions. The first Hall plate 202 includes two pairs of oppositely-oriented nodes at its corners, a first pair of nodes p1+ and p1−, and a second pair of nodes p2+ and p2−. FIG. 2A shows the first Hall plate 202 biased by a current signal I applied between nodes p2+ and p2−, and FIG. 2B shows the first Hall plate 202 biased by the current signal I applied between nodes p1+ and p1−.

When a Hall plate, such as the first Hall plate 202, is biased by an input signal, its sensitivity is a function of the bias signal magnitude, a correction factor defined by the geometry of the particular plate, and a resistance characteristic of the plate. The resistance characteristic of the plate, sometimes referred to as a Hall coefficient, is (for an n-type semiconductor) a function of the electron concentration and the Hall factor, and the Hall factor depends on temperature and scattering, among other things.

In an example, an ideal Hall plate can be modeled as a balanced Wheatstone bridge that, in the absence of a magnetic field, provides a uniform output voltage under stable bias conditions. A real Hall plate, however, exhibits a differential output voltage due to offset that can be caused by a magnetic field. The offset can be measured and exploited to identify or characterize stress on the Hall plate, as further explained herein.

In an example, a Hall plate voltage, $V_H$ in the examples of FIG. 2A and FIG. 2B, is linearly dependent on the bias signal magnitude, and can be modeled as:

$$\begin{bmatrix} V_1 \\ V_2 \end{bmatrix} = \begin{bmatrix} R_{H11} & R_{H12} \\ R_{H21} & R_{H22} \end{bmatrix} \begin{bmatrix} I_1 \\ I_2 \end{bmatrix} \quad \text{(Eq. 1)}$$

where $V_1$ is the voltage between nodes p1+ and p1−, and $V_2$ is the voltage between nodes p2+ and p2−, and where $I_1$ is the current applied between nodes p1+ and p1−, and $I_2$ is the current applied between nodes p2+ and p2−. The voltages $V_1$ and $V_2$ are thus functions of the biasing current input signal and the Hall coefficients, or $R_{Hxx}$, that describe the resistive behavior of the Hall plate. In other words, values of the Hall coefficients can be used as a surrogate for, or can represent, the influence of an external magnetic field on the Hall plate.

In the example of FIG. 2A, the Hall voltage $V_H = V_1 = R_{H12}I_2$. In the example of FIG. 2B, $V_H = V_2 = R_{H21}I_1$. In the example of the first Hall plate 202, the impedance matrix that describes the system is anti-symmetric in the presence of a magnetic field, and therefore the Hall coefficients corresponding to orthogonal axes can be equal and opposite. That is, $R_{H12} = -R_{H21}$ due to the Hall effect.

Figure 3A:
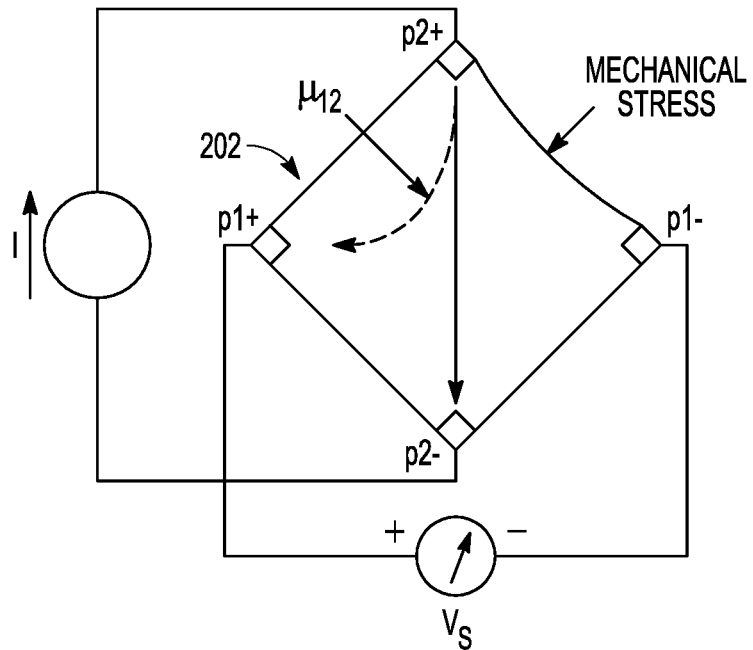
FIG. 3A and FIG. 3B illustrate generally examples of mechanical stress on a Hall plate.
Figure 3B:
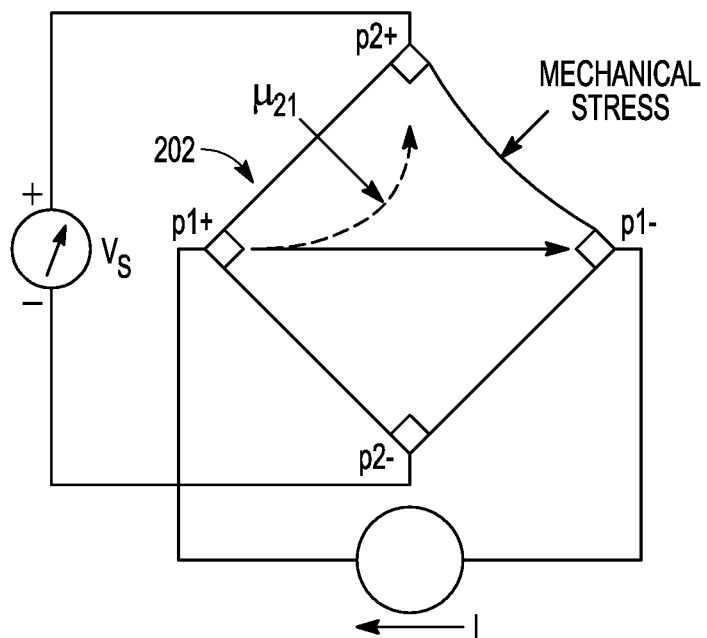

In an example and independent of magnetic field effects, an effect of mechanical stress on a Hall plate can similarly be modeled as a bridge. FIG. 3A and FIG. 3B illustrates generally graphical examples of mechanical stress on a Hall plate, such as the first Hall plate 202, and its influence on particular off-diagonal mobility characteristics of the Hall plate. Characteristics of the first Hall plate 202 can be optimized for sensitivity to stress, for example, to match another IC device (e.g., in terms of doping or material type, physical dimensions, etc.) for which stress compensation is desired.

In non-stressed silicon, electron mobility in the Hall plate can be modeled as a scalar function of the applied bias or electric field. That is, $$\begin{bmatrix} J_1 \\ J_2 \end{bmatrix} = q\mu \begin{bmatrix} E_1 \\ E_2 \end{bmatrix} \quad \text{(Eq. 2)}$$

where J is the electron mobility, E is the applied electric field, q is the electron charge, and μ is a constant based on the characteristics of the silicon itself when it is non-stressed. Under stress, electron mobility can be described by a tensor relationship. For example, $$\begin{bmatrix} J_1 \\ J_2 \end{bmatrix} = q \begin{bmatrix} \mu_{11} & \mu_{12} \\ \mu_{21} & \mu_{22} \end{bmatrix} \begin{bmatrix} E_1 \\ E_2 \end{bmatrix} \quad \text{(Eq. 3)}$$

where μ corresponds to the off-diagonal mobility components of electrons (e.g., for an n-type semiconductor) or holes (e.g., for a p-type semiconductor), or the influence of stress throughout the Hall plate. These off-diagonal mobility coefficients can be measured indirectly, for example, using a bridge model similar to that in Equation 1. That is, $$\begin{bmatrix} V_1 \\ V_2 \end{bmatrix} = \begin{bmatrix} R_{S11} & R_{S12} \\ R_{S21} & R_{S22} \end{bmatrix} \begin{bmatrix} I_1 \\ I_2 \end{bmatrix} \quad \text{(Eq. 4)}$$

where $R_{Sxx}$ represent the resistance tensor coefficients that describe the behavior of the Hall plate under stress. Stress can cause a change in the carrier mobility tensor that describes the plate. That is, the resistance of the plate can become directionally dependent, and off-diagonal components of the mobility tensor causes current deflection.

In an example, the off-diagonal coefficients $\mu_{xx}$ can provide information about the applied stress magnitude and applied stress direction or sign. Furthermore, due to reciprocity of electron mobility, it can be assumed that the off-diagonal coefficient $\mu_{12}$ is equal to μ21 and, correspondingly, $R_{S12}$ is equal to $R_{S21}$. This reciprocity relationship can be exploited to determine the magnitude and direction of the mechanical stress.

In an example that includes or uses the first Hall plate 202 to characterize mechanical stress, multiple measurements of the first Hall plate 202 can be used to cancel the influence of magnetic fields on the stress. For example, a first measurement can include measuring V1 using the configuration illustrated in FIG. 3A, and a second measurement can include measuring V2 using the configuration illustrated in FIG. 3B. Results of the first and second measurements can be processed together to eliminate magnetic field-indicating components and isolate the stress-indicating component. For example, $$R_{12} = R_{S12} + R_{H12} \quad \text{(Eq. 5)}$$

$$R_{21} = R_{S21} - R_{H21} \quad \text{(Eq. 6)}$$

From the discussion above, $R_{H12} = -R_{H21}$, and $R_{S12} = R_{S21}$. Accordingly the stress-indicating component can be given by $R_{S12} = R_{S21} = R_{12} + R_{21}$. In other words, the influence of any interfering magnetic field can be canceled by summing the results from the first and second measurements, and the remaining stress coefficient can correspond to the magnitude of the stress. Furthermore, information about an orientation of the Hall plate used in the first and second measurements as well as the sign of the stress-indicating component $R_{S12}$ can be used to characterize a direction of the stress.

Stress sensitivity, or the influence of stress, can depend at least in part on an orientation of a Hall plate relative to the crystalline orientation of the Hall plate substrate. In an example, a Hall plate can be used to sense mechanical stress magnitude and direction in or along multiple different axes, such as using multiple plates having different orientations on a substrate. Accordingly, multiple Hall plates can be used together to provide more information about an overall stress characteristic of a particular package. Multiple measurements can be performed using each Hall plate to characterize package stress and cancel the influence of any magnetic fields.

Figure 4A:
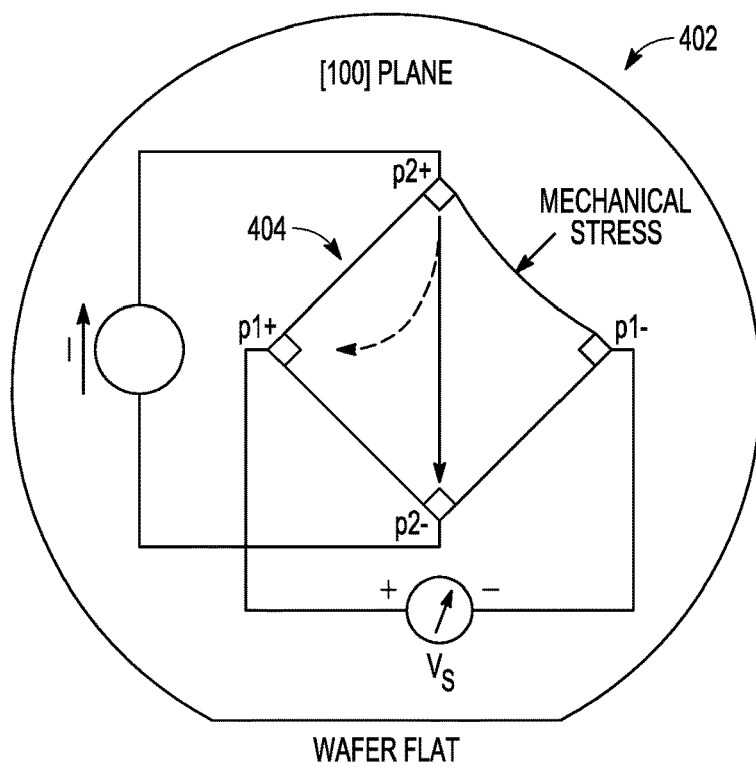
FIG. 4A and FIG. 4B illustrate generally examples of Hall plates with different orientations on a wafer.
Figure 4B:
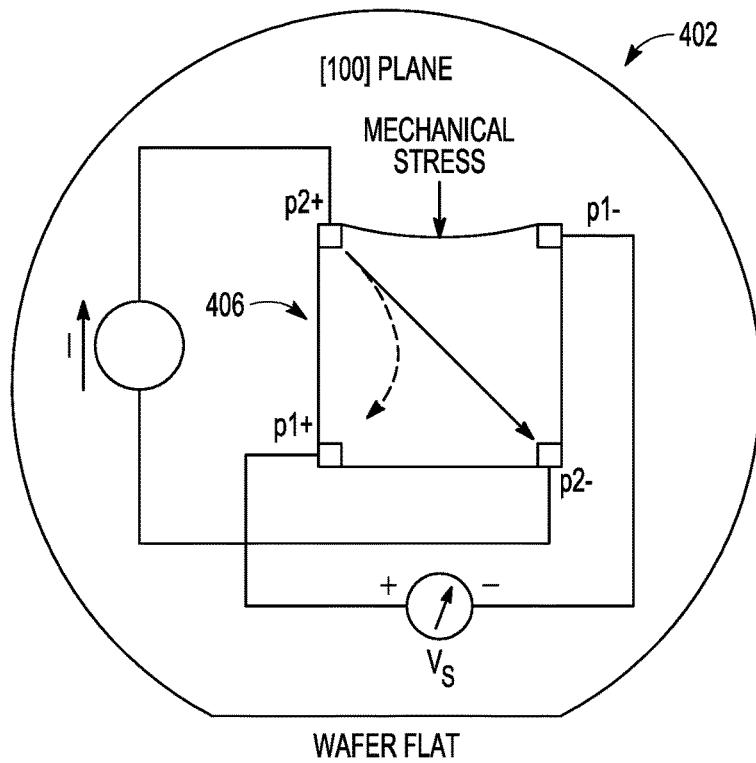

FIG. 4A and FIG. 4B illustrate generally examples that include Hall plates with different orientations on the same first wafer 402, such as comprising a doped silicon substrate. For example, FIG. 4A illustrates an example of a second Hall plate 404 having a first orientation on the first wafer 402, and FIG. 4B illustrates an example of a third Hall plate 406 having a second orientation on the same first wafer 402. For sake of clarity, the third Hall plate 406 is omitted from the view of the first wafer 402 in FIG. 4A, and the second Hall plate 404 is omitted from the view of the first wafer 402 in FIG. 4B. The second Hall plate 404 and the third Hall plate 406 can be disposed at any respective locations on the first wafer 402, however, they can be preferably located proximally to each other.

In the example of FIG. 4A and FIG. 4B, the first wafer 402 has a particular crystalline orientation, e.g., with the second Hall plate 404 and the third Hall plate 406 provided with different orientations with respect to the plane [100] of the first wafer 402. The second Hall plate 404 can be configured to measure electron mobility deviation in one plane of the first wafer 402, and the third Hall plate 406 can be configured to measure electron mobility deviation in a different plane of the first wafer 402. Accordingly, the second Hall plate 404 and the third Hall plate 406 can be used together to provide information about stresses on the first wafer 402 in multiple different axes corresponding to the different planes.

Figure 5:
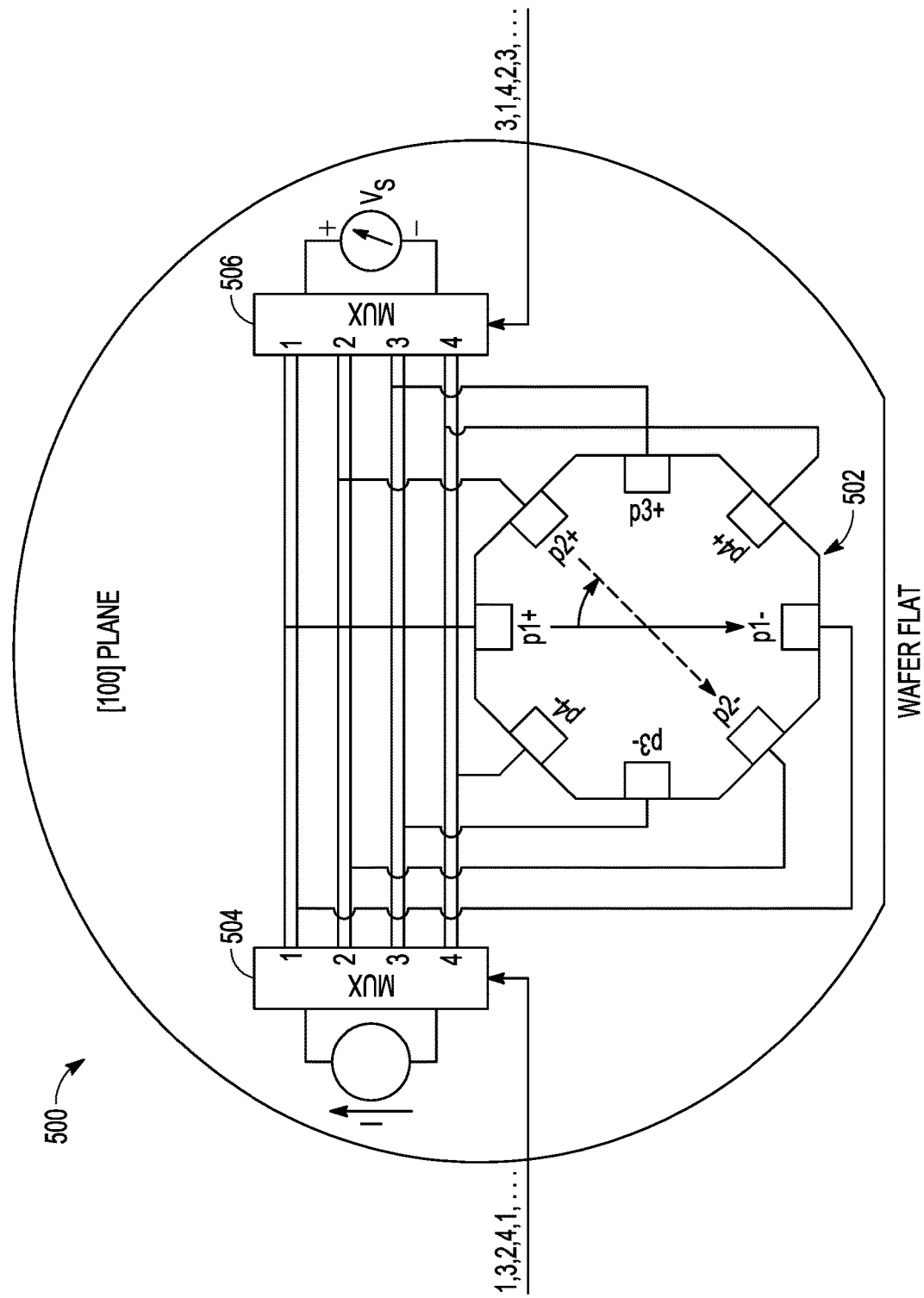
FIG. 5 illustrates generally an example of a non-rectangular Hall plate for stress sensing.

FIG. 5 illustrates generally an example of a stress sensor system 500 that includes an octagonal Hall plate 502 provided on a [100] plane of a wafer. The stress sensor system 500 can include a bias signal source coupled to the octagonal Hall plate 502 using a bias signal multiplexer circuit 504, and the stress sensor system 500 can include a measurement circuit coupled to the octagonal Hall plate 502 using a measurement signal multiplexer circuit 506.

The octagonal Hall plate 502 includes four pairs of nodes (e.g., p1+/−, p2+/−, p3+/−, and p4+/−) corresponding respectively to each of its sides. The nodes can be separately addressed by the bias signal multiplexer circuit 504 to receive respective excitation signals, and the nodes can be separately addressed by the measurement signal multiplexer circuit 506 to measure respective responses to the excitation signals. Multiple excitation signals can be provided and corresponding multiple response signals can be measured to characterize mechanical stress on the octagonal Hall plate 502 in one or more directions and the effect or influence of any magnetic fields can be canceled.

In an example, an off-diagonal stress resistance or stress coefficient for a first plane direction can be given by $$2R_{S13} = R_{13} + R_{31} \quad \text{(Eq. 7)}.$$

The off-diagonal stress resistance or stress coefficient for a second plane direction (e.g., rotated 45 degrees with respect to the first plane direction) can be given by $$2R_{S24} = R_{24} + R_{42} \quad \text{(Eq. 8)}.$$

In an example, Equations 7 and 8 can be used together to characterize mechanical stress, without the influence of a magnetic field, in any direction. For example, using the off-diagonal stress components identified by Equations 7 and 8, the stress in any direction can be provided as a linear combination of $C_1 R_{S13} + C_2 R_{S24}$, where C1 and C2 are empirically determined coefficients, such as can be derived from a stress calibration procedure.

Figure 6:
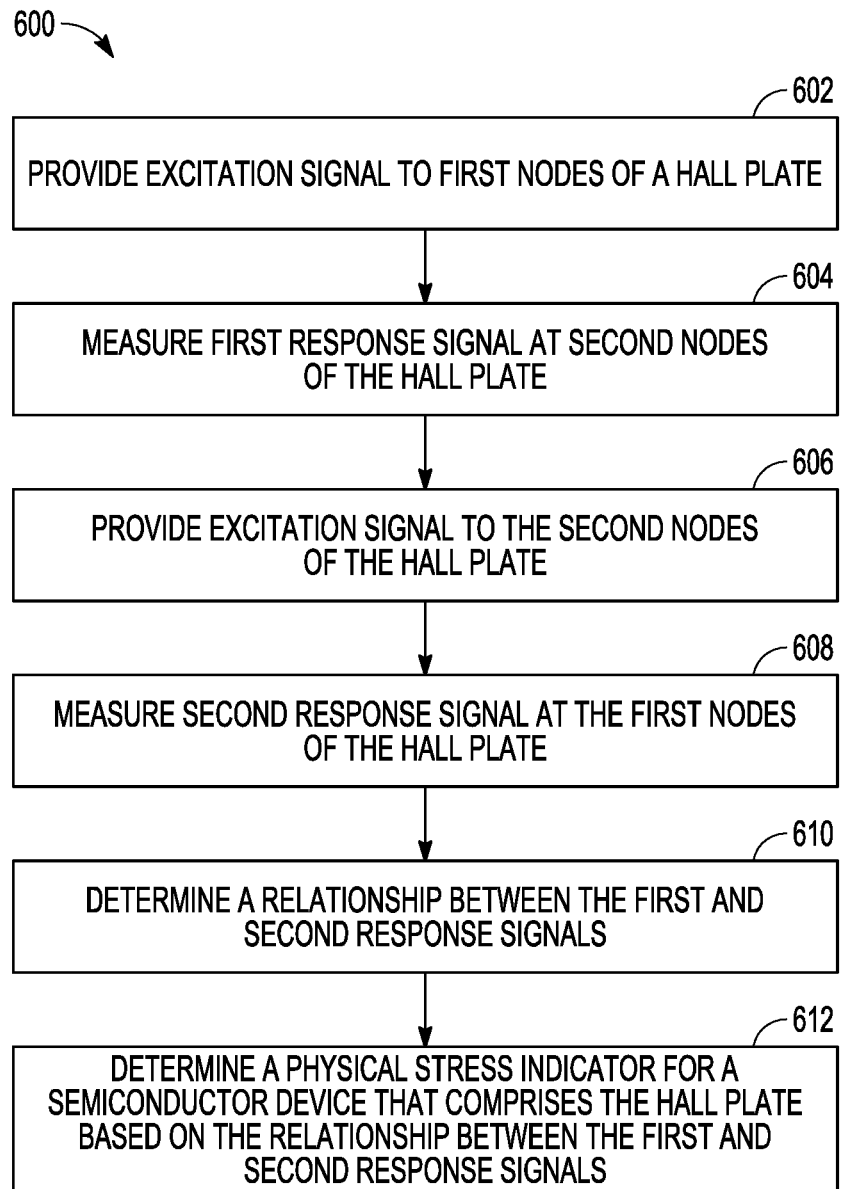
FIG. 6 illustrates an aspect of the subject matter in accordance with one embodiment.

FIG. 6 illustrates generally an example of a first method 600 that can include using a Hall plate sensor to provide information about physical stress on the sensor or on a semiconductor that comprises the sensor. At block 602, the first method 600 includes providing an excitation signal to first nodes of a Hall plate that comprises the sensor. The Hall plate can include a crystalline structure (e.g., a doped semiconductor) that is provided on or coupled to a substrate that is in common with one or more other parts or components for which stress is to be measured. The Hall plate can comprise a symmetrical structure about at least two axes. The first nodes can be provided at opposite side edges or edge regions of a first one of the axes and second nodes can be provided at opposite side edges or edge regions of a second one of the axes. In an example, the first and second axes can be orthogonal.

At block 604, the first method 600 can include measuring a first response signal at the second nodes of the Hall plate. In an example, block 602 and block 604 are performed concurrently such that the excitation signal is provided at block 602 at the same time that the response is measured at block 604.

At block 606, the first method 600 includes providing an excitation signal to the second nodes of the Hall plate. At block 608, the first method 600 includes measuring a second response signal at the first nodes of the Hall plate. In an example, the same excitation signal can be used, at respective different times, for block 602 and for block 606. That is, a voltage or current stimulus signal having first signal characteristics (e.g., amplitude, duration, waveform morphology, etc.) can be provided to the first nodes to evoke the first response signal and a stimulus signal having the same first signal characteristic can be provided to the second nodes to evoke the second response signal from the Hall plate.

At block 610, the first method 600 can include determining a relationship between the first and second response signals measured at block 604 and block 608. The relationship can provide information about off-diagonal charge carrier mobility characteristic of the Hall plate, which in turn can be used as a surrogate for stress on the Hall plate and the semiconductor that comprises the Hall plate. In an example, block 610 includes determining a magnitude difference between the first and second response signals. In an example, block 610 includes summing information about the magnitudes of the first and second response signals and determining a resistance characteristic of the Hall plate. The resistance characteristic can be a tensor that describes nonlinear characteristics of the Hall plate.

At block 612, the first method 600 can include determining a physical stress indicator for the Hall plate sensor, or for a semiconductor comprising the sensor, based on the relationship determined at block 610.

Hall sensors are generally optimized in terms of material composition or orientation to receive or capture a magnetic field. For example, a Hall sensor or Hall plate can comprise a semiconductor with high carrier mobility to help maximize sensitivity to the influence of small magnetic fields. The present inventors have recognized, however, that a stress sensor may not require or use materials with greatest mobility. Instead, it may be desirable to provide a stress sensor that is shaped or configured similarly or identically to a device upon which the effect of stress is desired to be known. For example, for a particular functional device or IC it can be desirable to use an identically or similarly configured other device (e.g., in terms of size, shape, material composition, die or wafer location, etc.) as a sensor to sense stress.

In an example, a layered semiconductor can be used as the particular device and the sensor. For example, a bipolar transistor device can be used. Deflection in the layered device can influence the magnitude or direction of current flow. This deflection can be sensed and used as a surrogate or indicator of mobility in the substrate, which in turn can indicate mechanical stress.

For example, a bipolar transistor can be provided with a split collector or multiple collector terminals. Deflection of current between the different collector terminals can cause a voltage difference across the base region of the transistor. The voltage difference, which can manifest as a measurable current difference between the collectors, indicates the cross mobility of the device.

Figure 7A:
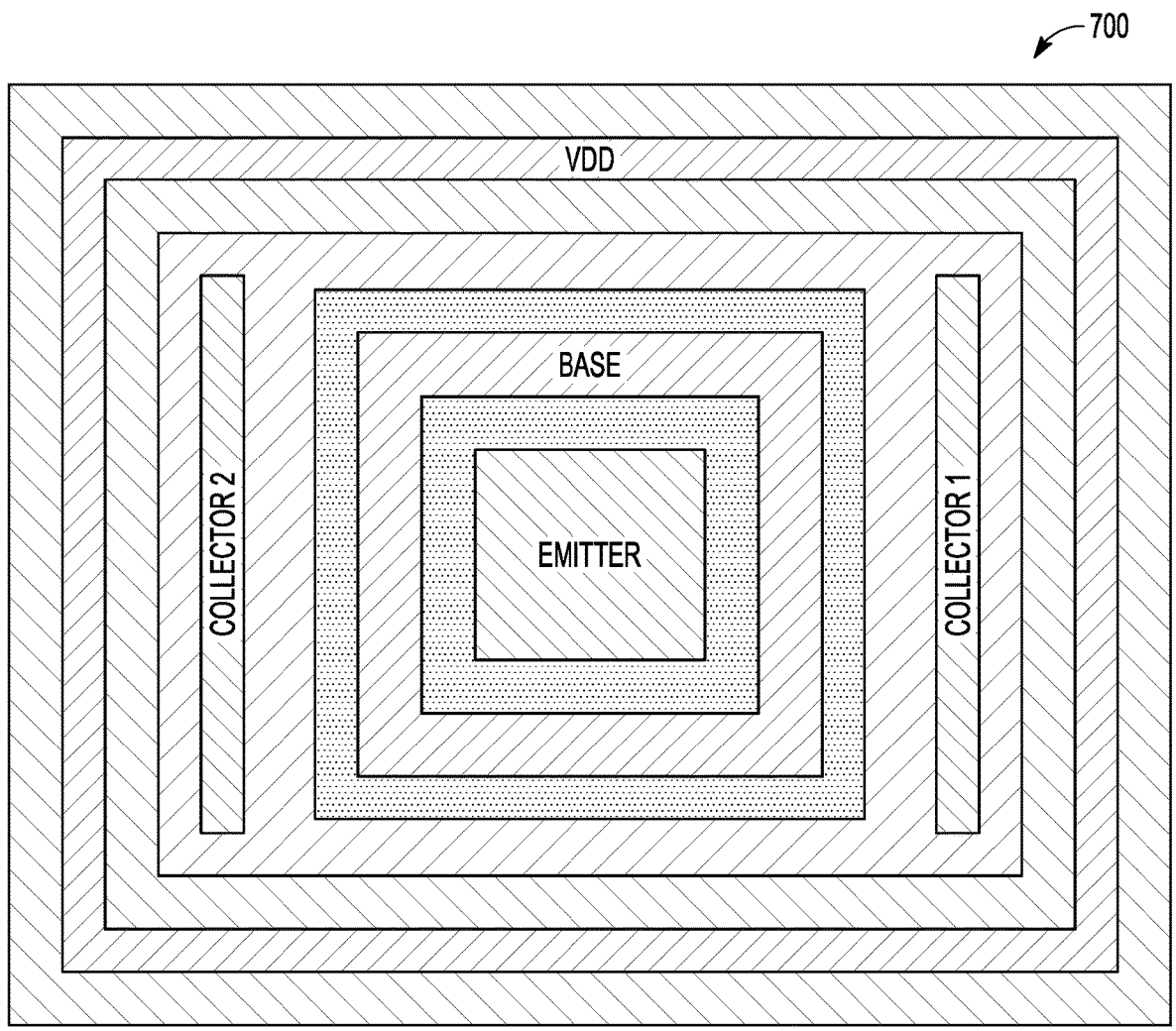
FIG. 7A illustrates generally an example of a top view of a physical layout of a first bipolar junction transistor.
Figure 7B:
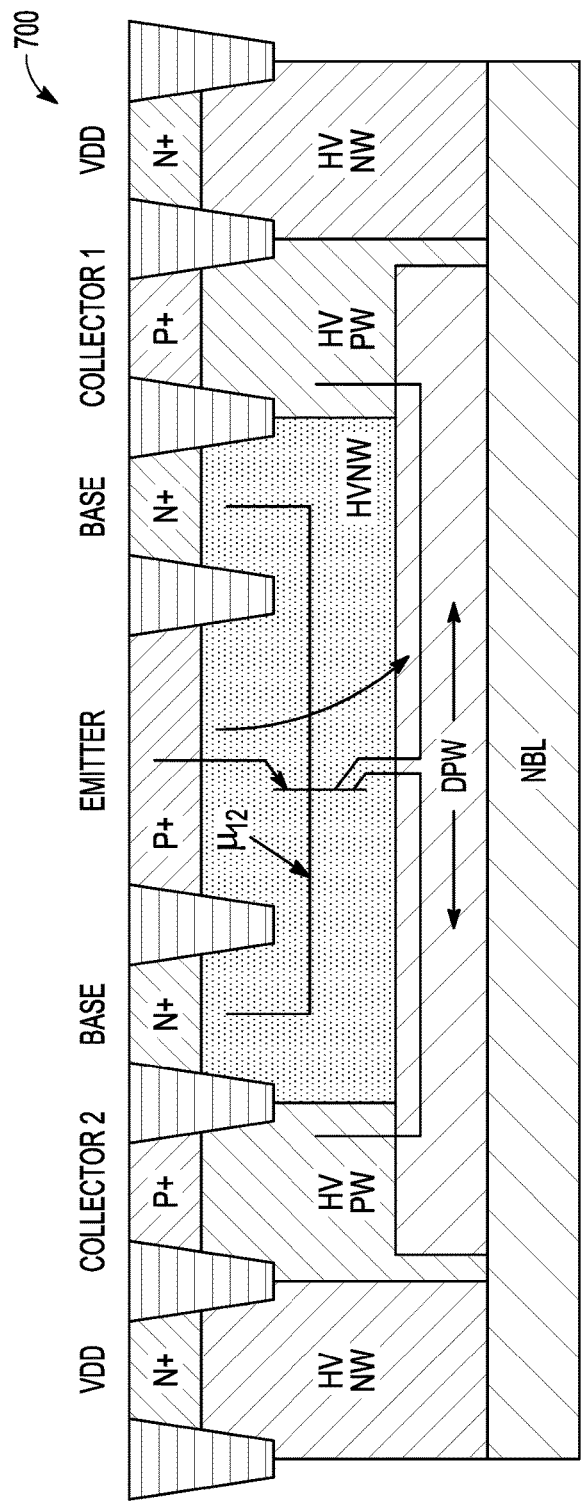
FIG. 7B illustrates generally an example of a cross-section view of a physical layout of the first bipolar junction transistor.

FIG. 7A illustrates generally an example of a top view of a physical layout of a bipolar junction transistor, or a first BJT device 700, with split collectors. FIG. 7B illustrates generally an example of a cross section view of the layout of the first BJT device 700 with split collectors. The illustration in FIG. 7B includes a schematic diagram of the first BJT device 700 showing the split collectors. The PNP first BJT device 700 includes terminals for the emitter, base, and the two collectors (collector 1 and collector 2), and for a body bias signal (VDD). In the example of FIG. 7A and FIG. 7B, the first BJT device 700 includes a deep p-well (DPW) that connects to the respective different collector terminals, and the device base is implemented with a high-voltage n-well (HVNW). The first BJT device 700 further comprises an n-type buried layer (NBL), and various other n-well (NW) and p-well (PW) regions. In some examples, the DPW could include a slit or other interruption in the DPW layer between, and separating, the collector current paths.

Figure 8A:
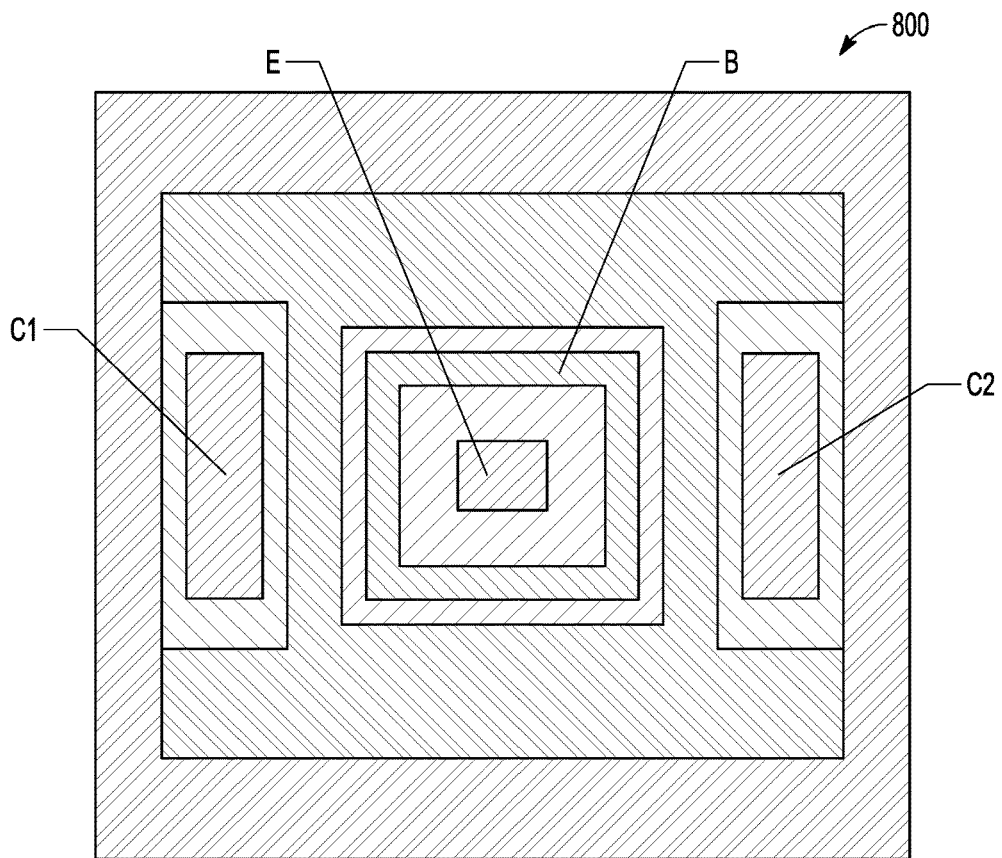
FIG. 8A illustrates generally an example of a top view of a physical layout of a second bipolar junction transistor.
Figure 8B:
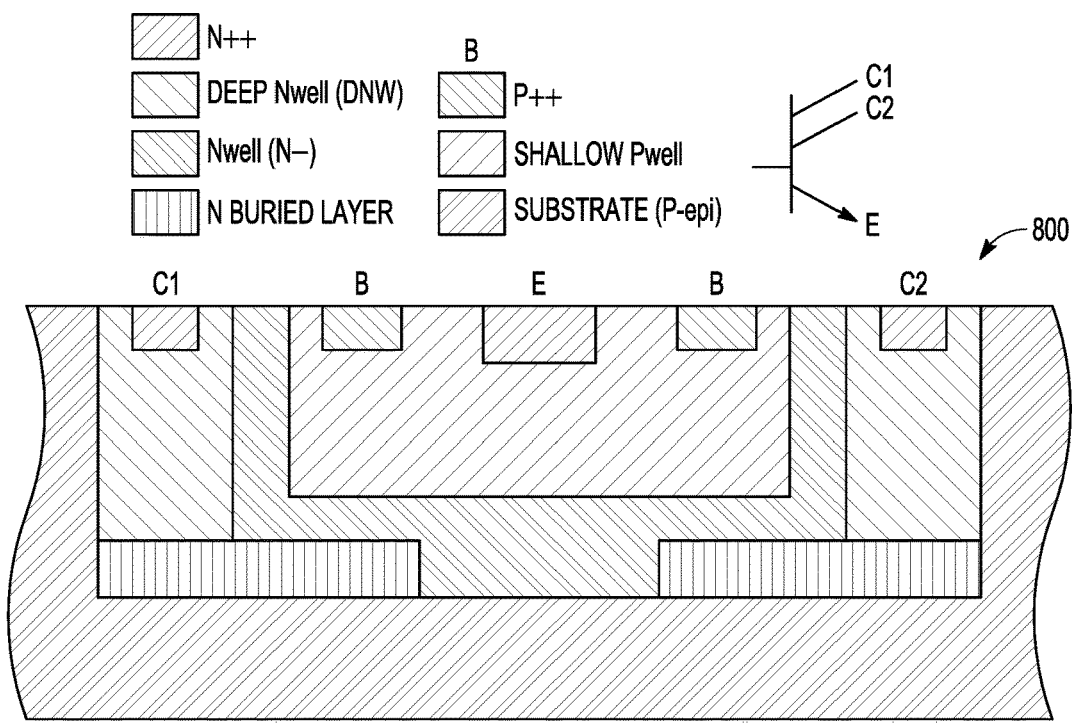
FIG. 8B illustrates generally an example of a cross-section view of a physical layout of a second bipolar junction transistor.

FIG. 8A illustrates generally an example of a top view of a physical layout of an NPN bipolar junction transistor, or a second BJT device 800, with split collectors. FIG. 8B illustrates generally an example of a cross section view of the layout of the second BJT device 800 with split collectors. In the example of the second BJT device 800, the N-type buried layer can have a slit or interruption that increases a resistance between the collector terminals C1 and C2. In some examples, a relatively less sensitive current sensing circuit can be used to measure the collector currents when the internal resistance between the collector terminals is increased.

Figure 7C:
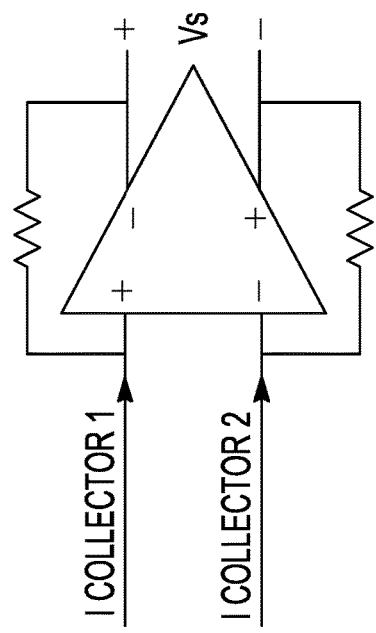
FIG. 7C illustrates generally an example of a schematic diagram of a differential signal measurement circuit.

In the presence of mechanical stress, the cross mobility behavior of the first BJT device 700 or the second BJT device 800 can be sensed as a differential signal between the collector terminals. FIG. 7C illustrates generally a schematic diagram of an amplifier circuit that can be used to measure the differential signal as a voltage signal Vs. In other words, the deflection current, μ12, due to stress can cause a voltage difference or non-uniformity across (e.g., primarily across) the base region, such as in the horizontal plane of the BJT device. As a result, a corresponding base-emitter voltage difference exists and current flows non-uniformly or unequally to the different collector terminals, collector 1 (C1) and collector 2 (C2).

In an example, the current signals, or the differential current signal, can be relatively difficult to measure due to the small difference between the signals at the respective collector terminals. A solution to the measurement problem can include providing high-resistance collector regions. The high-resistance collectors can be realized, for example, by pinching off the deep p-well (DPW) region in the first BJT device 700, pinching off the N-type buried layer in the second BJT device 800, or increasing a width of the emitter region.

The base region current behavior can be modeled using a tensor relationship between the mobility and charge concentration. For example, $$\begin{bmatrix} J_1 \\ J_2 \end{bmatrix} = qD \begin{bmatrix} \mu_{11} & \mu_{12} \\ \mu_{21} & \mu_{22} \end{bmatrix} \begin{bmatrix} \partial_1 N \\ \partial_2 N \end{bmatrix} \quad \text{(Eq. 9)}$$

where $J_1$ is the current magnitude in the horizontal (deflected) direction, $J_2$ is the current magnitude in the vertical (e.g., emitter to base region) direction, q is the electron charge, D is a diffusion constant, $\mu_{ij}$ is the charge carrier (electron or hole) mobility, N is charge concentration, and $\partial_j N$ is the charge concentration gradient.

In this example, charge is injected vertically from the emitter terminal downward toward the base region. Accordingly, $\partial_1 N=0$, and $\partial_2 N>0$. In the absence of stress on the first BJT device 700, for example, the charge carrier mobility is zero (e.g., $\mu_{21}=0$), and current flows vertically (e.g., $J_1=0$). Under stress, however, current is deflected (e.g., $J_1 \neq 0$) and a difference in collector current in the first BJT device 700 can be detected at the terminals of collector 1 and collector 2 (e.g., using the differential sensor in FIG. 7C).

In an example, the first BJT device 700 or second BJT device 800, or variations thereof, can comprise a portion of a reference generator circuit, such as a voltage reference generator or current reference generator. A reference generator circuit can be used to provide a reference signal for use in various circuits. In an example, a reference signal can be used to provide a stable and accurate bias signal for use by various components or systems such as amplifiers, comparators, analog-to-digital converters, digital-to-analog converters, oscillators or phase locked loops, among others.

Various different types of reference generator circuits can be provided. Some examples of the different types can include a bandgap reference signal generator, a MOS-Vth difference-type reference signal generator, and a work function difference-type reference signal generator. A bandgap-type reference signal generator can be provided using bipolar junction transistor (BJT) devices, such as including the first BJT device 700 or the second BJT device 800. The bandgap-type generator can include voltage sources with respective positive and negative temperature coefficients such that, when the sources are summed, the temperature-dependence of the devices can be canceled. A bandgap-type reference signal generator can have some limitations, however, such as susceptibility to substrate noise or stress. When the multiple-collector BJT device is used in a reference signal generator, any offset due to package stress can be detected and mitigated, for example, using information about the differential current signals at the split collector terminals. In other words, the multiple-collector BJT device can comprise one or more of the devices that comprise a bandgap-type reference signal generator and information about the stress on the BJT device can be sensed, for example in a time-multiplexed manner with operation of the reference generator itself.

In other examples, a BJT-based reference generator circuit can comprise one or more transistors, and the first BJT device 700, second BJT device 800, or other multiple-collector BJT device, can be provided as a clone or replica device to one or more of the transistors of the generator circuit. The BJT device can be built physically near or adjacent to one or more transistors of the reference generator circuit such that information about stress from the BJT device can be sensed in real-time with operation of the reference generator circuit. In an example, multiple instances of a multiple-collector BJT device can be built physically around or adjacent to different sides of other components of a reference generator. Each of the multiple instances can be used to separately characterize stress, for example, which can unequally impact the devices that comprise the generator circuit due to the different physical locations of such devices about the package or substrate that comprises the generator.

In alternative examples for sensing stress in or around a bandgap-type reference signal generator circuit, current flow through multiple paths in a pinched resistor can be used instead of a multiple-collector BJT device. In this example, a pinched resistor can comprise the same material as a base region of a bipolar transistor in the generator circuit. That is, if the bandgap circuit uses an NPN transistor with a p-type base, then the pinched resistor can comprise a p-type material; if the bandgap circuit uses a PNP transistor with an n-type base, then the pinched resistor can comprise an n-type material.

Figure 9:
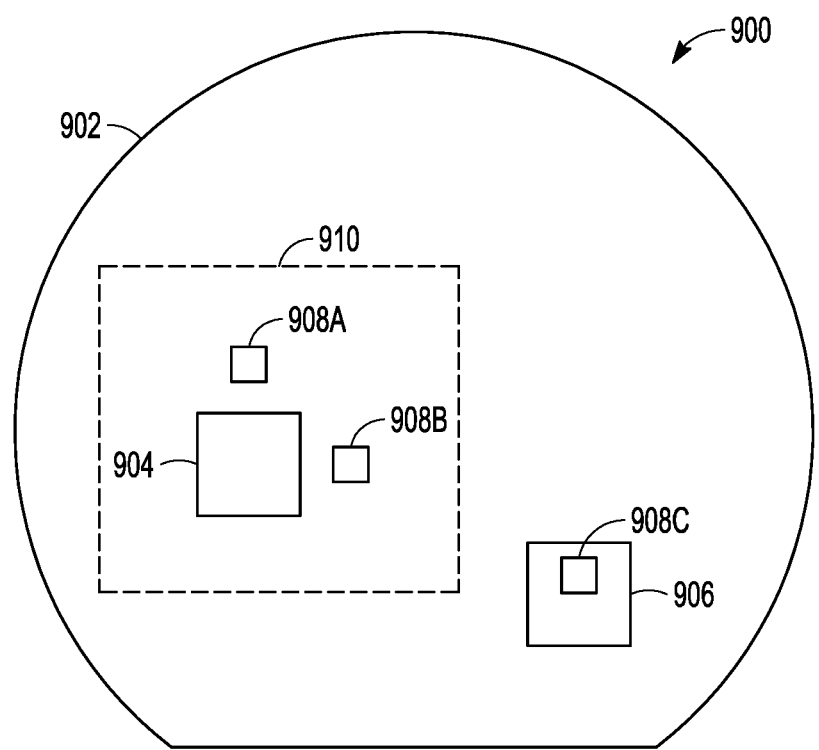
FIG. 9 illustrates generally an example of a reference generator circuit built on a semiconductor wafer.

FIG. 9 illustrates generally an example layout 900 for a first IC wafer 902. The first IC wafer 902 can include a first reference generator circuit 904 and a second reference generator circuit 906. Each of the first reference generator circuit 904 and the second reference generator circuit 906 can comprise a transistor-based (e.g., bandgap-type) reference generator circuit that includes or uses multiple transistors, resistors, or other IC-based components to generate a reference current signal or reference voltage signal. Portions of the first IC wafer 902 can be diced and separately packaged.

In an example, the first IC wafer 902 includes one or multiple stress sensor circuits configured to measure physical stress at respective different areas of the first IC wafer 902. For example, the first IC wafer 902 can include first die 910 comprising a first stress sensor 908a proximal to the first reference generator circuit 904 and a second stress sensor 908b proximal to the first reference generator circuit 904. That is, the first reference generator circuit 904 can include or use multiple stress sensors having a shared or common substrate with the reference generator itself, such as on the same die. In the example of FIG. 9, the first stress sensor 908a and the second stress sensor 908b are provided adjacent to respective sides or side regions of the circuitry that comprises the first reference generator circuit 904. In an example, the first reference generator circuit 904, the first stress sensor 908a, and the second stress sensor 908b comprise a portion of the first IC wafer 902 that can be packaged together.

The first stress sensor 908a or the second stress sensor 908b can comprise respective transistor devices that are identically sized or shaped to transistor devices that comprise the first reference generator circuit 904. That is, the first stress sensor 908a or the second stress sensor 908b can comprise devices that are clones of, or replica devices of, one or more devices in the first reference generator circuit 904. For example, the devices can have the same, or substantially the same, width, length, material type or doping characteristics. The devices can be located near or adjacent to one another such that they can be nearly identical in terms of any process-related variations or inconsistencies.

In an example, the first reference generator circuit 904 comprises, or can be coupled to, a processor circuit configured to receive reference signal information from, e.g., a bandgap-type reference generator and to receive one or more correction signals from the first stress sensor 908a and second stress sensor 908b. The processor circuit can use the one or more correction signals to update or adjust the reference signal information from the reference generator to provide a stress-corrected reference signal. The stress-corrected reference signal can include a voltage or current reference signal that is invariant to the influence of package stress or deformation of the first IC wafer 902 or of a package comprising the first reference generator circuit 904, the first stress sensor 908a, and the second stress sensor 908b.

In an example, the second reference generator circuit 906 comprises a third stress sensor 908c. The third stress sensor 908c can comprise a portion of the second reference generator circuit 906 itself. That is, the second reference generator circuit 906 can include a transistor-based reference generator circuit and the third stress sensor 908c can comprise a transistor that is used by the second reference generator circuit 906 to generate a reference signal. In an example, the second reference generator circuit 906 includes a multiplexer circuit that is configured to use the third stress sensor 908c to generate the reference signal and to generate a stress-indicating correction signal during respective time intervals. The second reference generator circuit 906 can be configured to provide a stress-corrected reference signal based on information from the third stress sensor 908c about stress on the third stress sensor 908c.

In other words, reference circuits can be constructed in various ways. In one example, a reference circuit can comprise components that are separate from stress sensing circuit components. A stress-indicating signal generated by the stress sensing circuit can be used to compensate for stress sensitivity of the reference circuit. In another example, a reference circuit can comprise a split-collector transistor that functions as part of a reference signal generator itself and as part of a stress sensor. In a discrete-time implementation, the split-collector transistor can be used during particular time intervals as a stress sensor and at other intervals as a component in a reference signal generator. In a continuous-time implementation, the split-collector transistor can be used simultaneously or concurrently as a reference generator and stress sensor. In this example, the base-emitter voltage of the transistor can comprise a portion of the reference generator circuit and, concurrently, a difference in the collector current can be measured as used to generate a stress-indicating signal that, in turn, can be used to compensate for stress effects on the generated reference signal.

Figure 10:
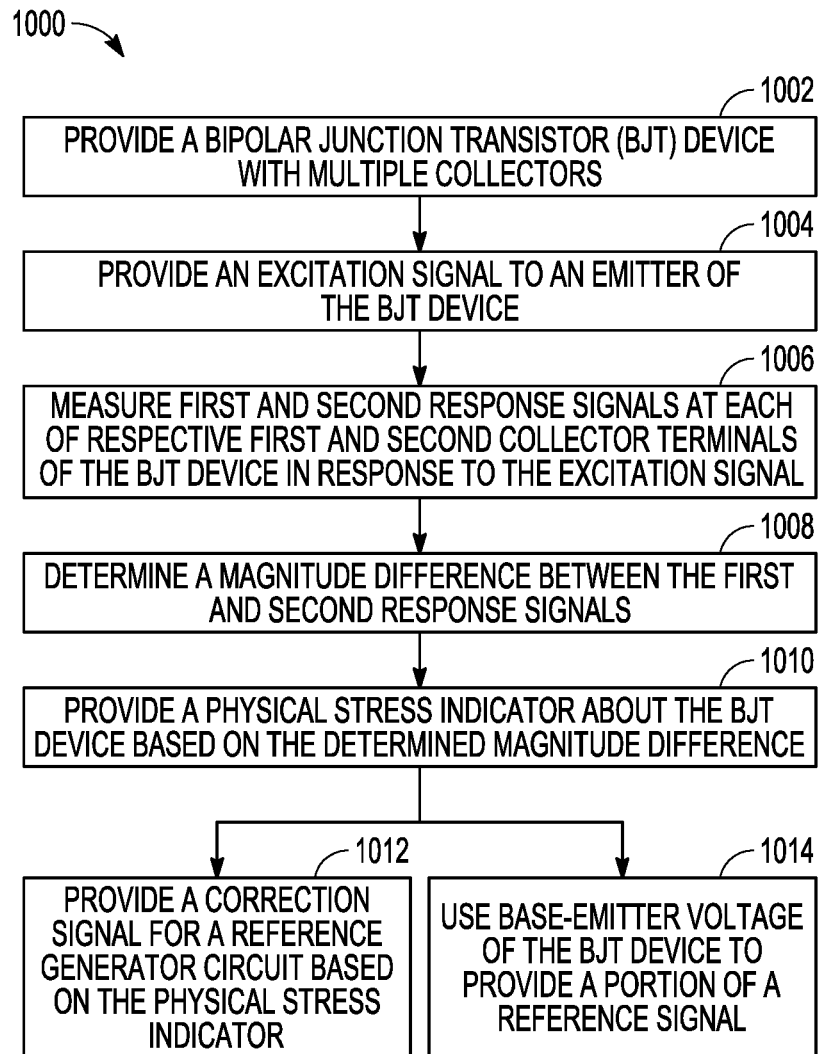
FIG. 10 illustrates generally an example of a method that can include using a bipolar transistor device to provide a physical stress indicator.

FIG. 10 illustrates generally an example a second method 1000 that can include using a transistor device to provide a physical stress indicator. At block 1002, the second method 1000 includes providing a bipolar junction transistor (BJT) device with multiple collectors, or a bifurcated collector. That is, block 1002 can include building a BJT device that includes a collector region that is coupled to two or more discrete terminals. An example of a BJT device with a bifurcated or split collector is provided in FIG. 7A and FIG. 7B. The BJT device with bifurcated collector can be subject to deflection of current in the base region of the device, for example, when the device is under mechanical stress. Although sometimes referred to herein as "bifurcated" it should be understood that the collector can have more than two discrete branches.

At block 1004, the second method 1000 includes providing an excitation or drive signal to an emitter of the BJT device. Under appropriate bias conditions, the BJT device can turn on and conduct current from the emitter through the base region and to each of first and second collector regions and corresponding first and second collector terminals. Although the examples discussed herein include a BJT device with two collectors, devices with more than two collectors can similarly be used. For example, a bipolar transistor device with four collectors can be used identify stress along two different axes.

At block 1006 and in response to the excitation signal, first and second response signals can be measured at the first and second collector terminals, respectively. Under the influence of package deformation or substrate stress, current flow through the base region of the BJT device can be interrupted or non-uniform. Accordingly, the response signals can have different magnitude characteristics that can be analyzed and exploited to provide information about a magnitude and/or direction of the package stress. For example, at block 1008 the second method 1000 can include determining a current magnitude difference between the first and second response signals. Based on the magnitude difference, a physical stress indicator can be provided. Based on the determined current magnitude difference, the second method 1000 can include providing a physical stress indicator about the BJT device at block 1010.

In an example, the BJT device in the second method 1000 can be used in or used with a reference generator circuit, such as a voltage signal or current signal generator circuit. At block 1012, the second method 1000 can include providing a correction signal for a reference generator circuit based on the physical stress indicator from block 1010. That is, block 1012 can include using the physical stress indicator to provide information about a correction for a reference generator circuit wherein one or more components of the reference generator circuit are subject to the same or similar stress as the BJT device. In some examples, the BJT device is a clone or replica of one or more devices in the reference generator circuit and/or is built physically near to one or more devices in the reference generator circuit.

In an example, at block 1014, the reference generator circuit can include or use the BJT device itself. For example, a base-emitter voltage (Vbe) characteristic of the BJT device can be used, such as together with information about a Vbe characteristic of a second device loaded with a different current density, to provide a reference signal, or can be used by the reference generator circuit to provide a component of another reference signal.

Figure 11:
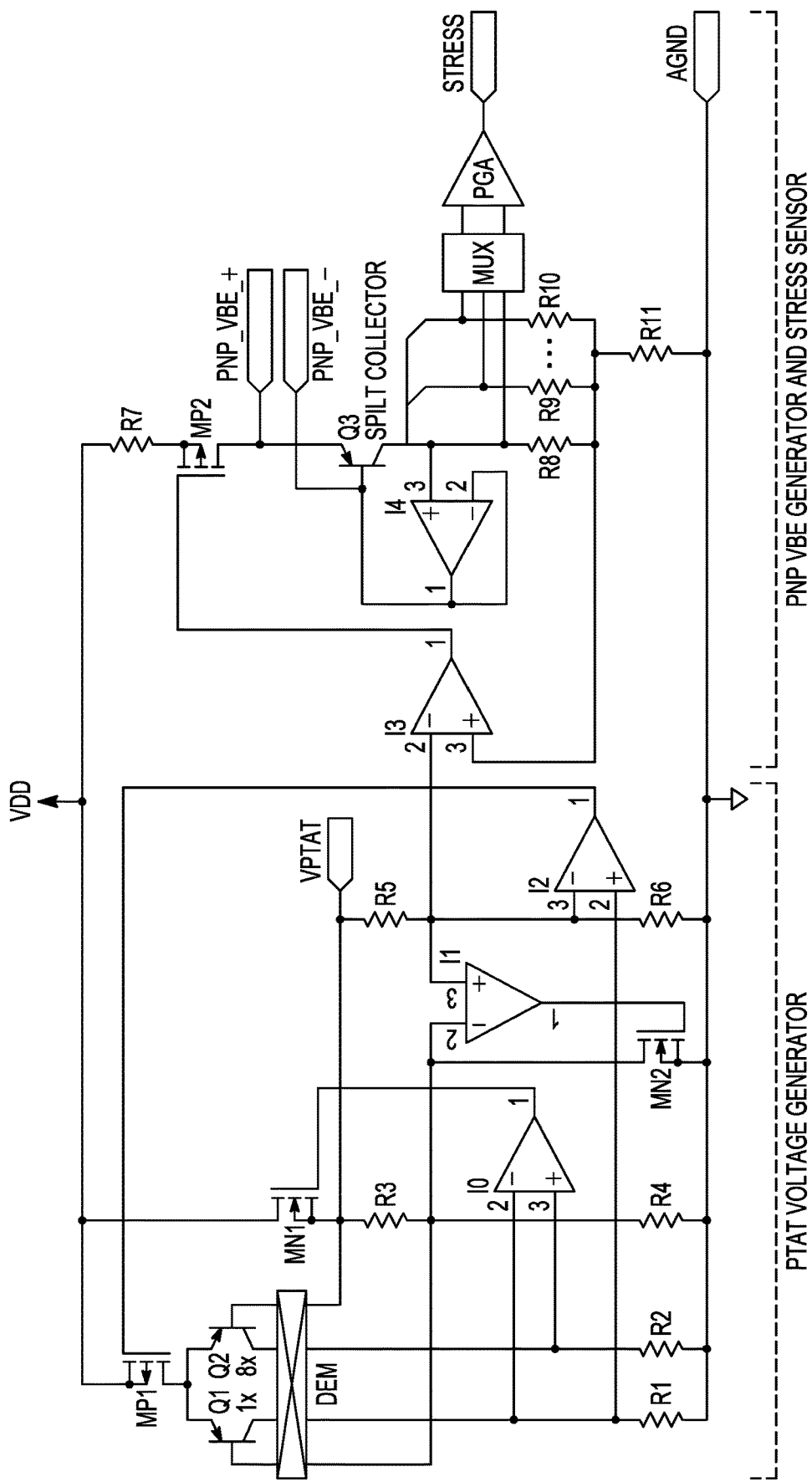
FIG. 11 illustrates generally an example of a reference generator circuit comprising a bipolar junction transistor with split collectors.

FIG. 11 illustrates generally an example of a reference generator circuit 1100. The reference generator circuit 1100 includes a stress-immune voltage reference generator with a PNP BJT device configured as a stress sensor. The reference generator circuit 1100 includes a proportional-to-absolute-temperature (PTAT) voltage generator (left) and an PNP VBE generator (right). The reference generator circuit 1100 includes various amplifier circuits (labeled I0, I1, I2, I3) and a programmable gain amplifier (PGA) such as can be chopped to increase precision and eliminate drift.

In an example, the reference generator circuit 1100 includes a high-precision PTAT voltage generator comprising transistors Q1 and Q2, amplifier circuits I0, I1, I2, and transistors MN1, MN2, MP1, and resistors R1-R6. The amplifier circuit I0 provides a PTAT voltage across R3 by forcing equal collector currents in transistors Q1 and Q2. The base current of Q1 is canceled by the loop established by amplifier circuit I1 and transistor MN2, and accordingly the voltage drop across R5 can be considered proportional to absolute temperature without base current errors. In this example, canceling the base current of Q1 eliminates errors due to beta variation as a function of stress, temperature and process spread. The amplifier circuit I2 is configured to force the collector currents of transistors Q1 and Q2 to be proportional to absolute temperature.

In an example, in addition to any package stress on the reference generator circuit 1100, silica particles in the mold compound fill used in plastic packages can create point stresses on the device surface. In some cases, if a silica particle applies stress directly over the transistor device Q1, then the voltage reference can exhibit aberrant performance over temperature. To reduce the effects of these or other local stresses, the PTAT voltage generator can alternate the position of the transistor Q1 using, e.g., dynamic element matching (DEM).

The PNP VBE generator of the reference generator circuit 1100 can include the transistor Q3, such as can comprise a PNP device with multiple collectors, such as according to the example of the first BJT device 700, the second BJT device 800, or other multiple-collector BJT device. The VBE generator can further include a control loop comprising, e.g., the amplifiers I3 and I4. The respective collector currents in the transistor Q3 can be sensed by the voltage drops across resistors R8-R10, and the PGA can amplify the difference between any two collector currents selected by a multiplexer (MUX). In this example, the output of the PGA can be proportional to the combination of stress effects and any initial device mismatch. Changes in these difference signals over time can be used to compensate for stress effects evident in the reference voltage. In an example, the amplifier circuit I4 provides a virtual diode connection for transistor Q3 without injecting base current errors. The positive input of amplifier I4 can be implemented with a split MOS input pair to average all voltage drop signals across the resistors R8-R10, for example, rather than the one as shown in the reference generator circuit 1100. The amplifier loop comprising amplifier I3 and transistor MP2 can control the total collector current flowing in transistor Q3 and forces it to be proportional to absolute temperature.

An analog-to-digital converter (ADC) circuit can be used to measure the three differential signals {VPTAT, AGND}, {PNP VBE+, PNP VBE−} and {STRESS, AGND} to provide an implicit voltage reference signal for system calibration. In some examples, adding the differential PNP VBE measurement to a scaled PTAT voltage creates a first order temperature-compensated voltage, which can be stress-compensated using the measured difference in the collector currents.

Figure 12:
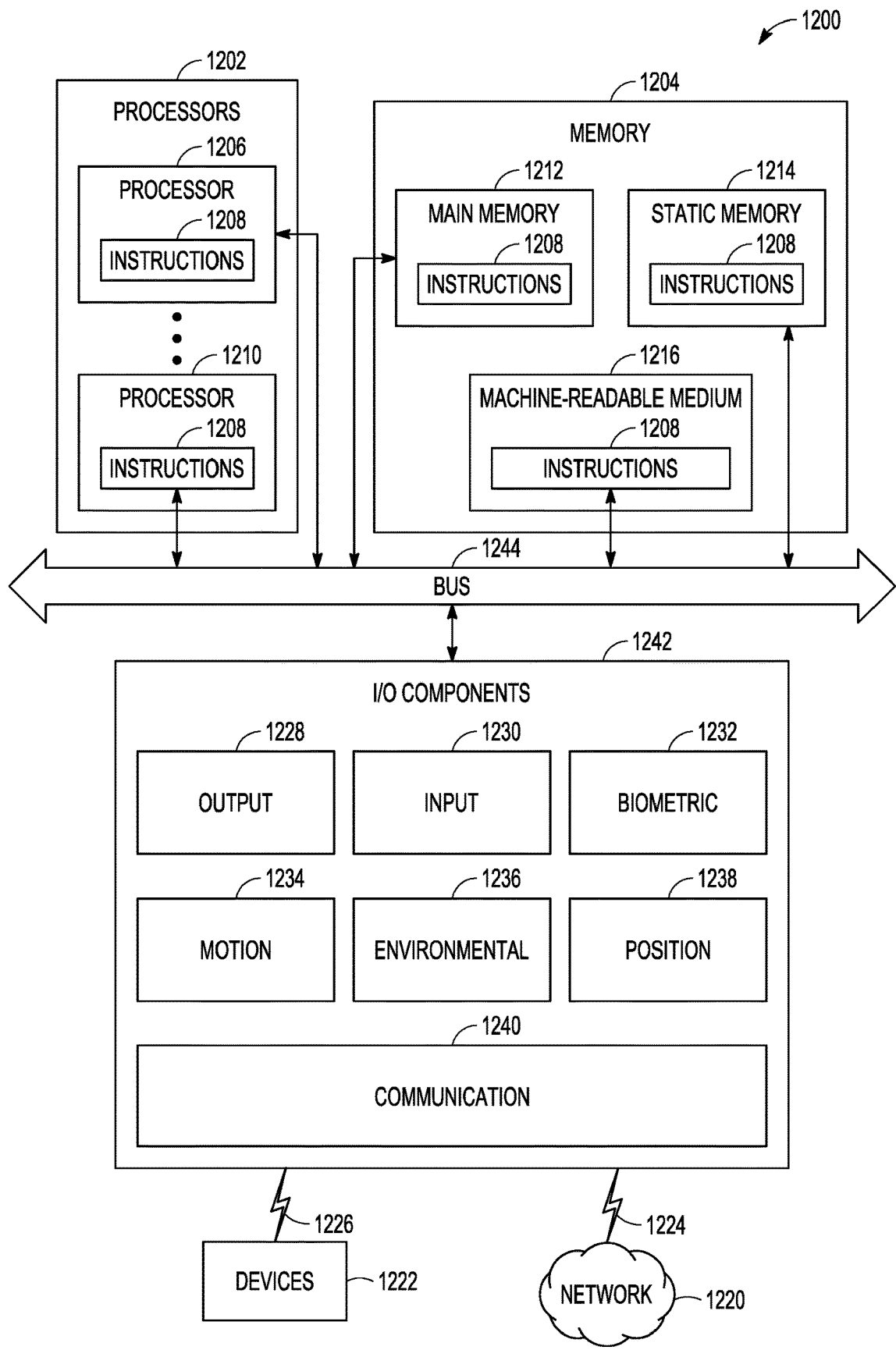
FIG. 12 is a block diagram illustrating an example computing device capable of performing aspects of the various techniques discussed herein.

FIG. 12 is a diagrammatic representation of a machine 1200 within which instructions 1208 (e.g., software, a program, an application, an applet, an app, or other executable code) for causing the machine 1200 to perform any one or more of the methodologies discussed herein may be executed. For example, the instructions 1208 may cause the machine 1200 to execute any one or more of the methods described herein, such as to generate or provide excitation signals, measure response signals, coordinate measuring timings or operations of a multiplexer circuit, calculate tensor relationships, provide physical stress-indicators for stress sensors, or generate a correction signal for use in a reference generator circuit, converter circuit, or other circuit, among other things. The instructions 1208 transform the general, non-programmed machine 1200 into a particular machine 1200 programmed to carry out the described and illustrated functions in the manner described. The machine 1200 may operate as a standalone device or may be coupled (e.g., networked) to other machines, such as to coordinate actions or functions across different circuits. In some examples, a mixed signal circuit implementation using analog-to-digital converter (ADC) and/or digital-to-analog converter (DAC) circuits can be used to measure and generate the analog signals that can be used to control the reference and stress sensing circuitry discussed herein, for example while performing most of the signal processing using digital technology. In other examples, all required signal processing in the current, charge and/or voltage domains can include or use analog signal processing techniques.

In a networked deployment, the machine 1200 may operate in the capacity of a server machine or a client machine in a server-client network environment, or as a peer machine in a peer-to-peer (or distributed) network environment. The machine 1200 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1208, sequentially or otherwise, that specify actions to be taken by the machine 1200. Further, while only a single machine 1200 is illustrated, the term "machine" shall also be taken to include a collection of machines that individually or jointly execute the instructions 1208 to perform any one or more of the methodologies discussed herein.

The machine 1200 may include processors 1202, memory 1204, and I/O components 1242, which may be configured to communicate with each other via a bus 1244. In an example embodiment, the processors 1202 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an ASIC, a Radio-Frequency Integrated Circuit (RFIC), another Processor, or any suitable combination thereof) may include, for example, a processor 1206 and a processor 1210 that execute the instructions 1208. The term "Processor" is intended to include multi-core processors that may comprise two or more independent processors (sometimes referred to as "cores") that may execute instructions contemporaneously. Although FIG. 12 shows multiple processors 1202, the machine 1200 may include a single processor with a single core, a single processor with multiple cores (e.g., a multi-core processor), multiple processors with a single core, multiple processors with multiples cores, or any combination thereof.

The memory 1204 includes a main memory 1212, a static memory 1214, and a storage unit 1216, both accessible to the Processors 1202 via the bus 1244. The main memory 1204, the static memory 1214, and storage unit 1216 store the instructions 1208 embodying any one or more of the methodologies or functions described herein. The instructions 1208 may also reside, completely or partially, within the main memory 1212, within the static memory 1214, within machine-readable medium 1218 within the storage unit 1216, within at least one of the processors 1202 (e.g., within the processor's cache memory), or any suitable combination thereof, during execution thereof by the machine 1200.

The I/O components 1242 may include a wide variety of components to receive input, provide output, produce output, transmit information, exchange information, capture measurements, and so on. The specific I/O components 1242 that are included in a particular machine will depend on the type of machine. For example, portable machines such as mobile phones may include a touch input device or other such input mechanisms, while a headless server machine will likely not include such a touch input device. It will be appreciated that the I/O components 1242 may include many other components that are not shown in FIG. 12. In various example embodiments, the I/O components 1242 may include output components 1228 and input components 1230. The output components 1228 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators or converters. The input components 1230 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 1242 may include various sensors such as can comprise one or more of biometric components 1232, motion components 1234, environmental components 1236, or position components 1238, among a wide array of other components. For example, the biometric components 1232 include components to detect expressions (e.g., hand expressions, facial expressions, vocal expressions, body gestures, or eye tracking), measure biosignals (e.g., blood pressure, heart rate, body temperature, perspiration, muscle oxygenation, or brain waves), identify a person (e.g., voice identification, retinal identification, facial identification, fingerprint identification, or electroencephalogram-based identification), and the like. The motion components 1234 can include the motion sensor 324 such as can include acceleration sensor components (e.g., accelerometer), gravitation sensor components, rotation sensor components (e.g., gyroscope), and so forth. The environmental components 1236 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 1238 include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1242 further include communication components 1240 operable to couple the machine 1200 to a network 1220 or devices 1222 via a coupling 1224 and a coupling 1226, respectively. For example, the communication components 1240 may include a network interface component or another suitable device to interface with the network 1220. In further examples, the communication components 1240 may include wired communication components, wireless communication components, cellular communication components, Near Field Communication (NFC) components, Bluetooth© components (e.g., Bluetooth© Low Energy), Wi-Fi© components, and other communication components to provide communication via other modalities. The devices 1222 may be another machine or any of a wide variety of peripheral devices (e.g., a peripheral device coupled via a USB).

Moreover, the communication components 1240 may detect identifiers or include components operable to detect identifiers. For example, the communication components 1240 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes and other optical codes), or acoustic detection components (e.g., microphones to identify tagged audio signals). In addition, a variety of information may be derived via the communication components 1240, such as location via Internet Protocol (IP) geolocation, location via Wi-Fi® signal triangulation, location via detecting an NFC beacon signal that may indicate a particular location, and so forth. Any of the aforementioned sensors, processors, or other components or circuits can include or use reference signal generator circuitry and/or correction circuitry as described herein.

The various memories (e.g., memory 1204, main memory 1212, static memory 1214, and/or memory of the Processors 1202) and/or storage unit 1216 may store one or more sets of instructions and data structures (e.g., software) embodying or used by any one or more of the methodologies or functions described herein. These instructions (e.g., the instructions 1208), when executed by Processors 1202, cause various operations to implement the disclosed embodiments.

The instructions 1208 may be transmitted or received over the network 1220, using a transmission medium, via a network interface device (e.g., a network interface component included in the communication components 1240) and using any one of a number of well-known transfer protocols (e.g., hypertext transfer protocol (HTTP)). Similarly, the instructions 1208 may be transmitted or received using a transmission medium via the coupling 1226 (e.g., a peer-to-peer coupling) to the devices 1222.

Various aspects of the present disclosure, presented herein as examples, can help provide a solution to the package stress problems identified herein. For example, Example 1 is a method comprising measuring a first electric signal from a first nodes of a Hall plate, the first electric signal responsive to a first stimulus, and the first electric signal indicative of a carrier mobility characteristic of the semiconductor device in a first direction, and measuring a second electric signal from second nodes of the Hall plate, the second electric signal responsive to a second stimulus, and the second electric signal indicative of the carrier mobility characteristic of the semiconductor device in the same first direction, and determining a physical stress indicator about a semiconductor device comprising the Hall plate based on a relationship between the first electric signal and the second electric signal.

In Example 2, the subject matter of Example 1 can include providing the first stimulus at the second nodes of the Hall plate and, in response, measuring the first electric signal, and providing the second stimulus at the first nodes of the Hall plate and, in response, measuring the second electric signal.

In Example 3, the subject matter of Example 2 can include the Hall plate comprising a doped semiconductor that is symmetrical about a first axis that extends between the first nodes and is symmetrical about a second axis that extends between the second nodes.

In Example 4, the subject matter of any one or more of Examples 2-3 can include measuring the first electric signal including measuring a first voltage signal, and the first stimulus can include a first current signal, and measuring the second electric signal including measuring a second voltage signal, and the second stimulus can include a second current signal.

In Example 5, the subject matter of Example 4 can include providing the first and second current signals at respective different times, and the first and second current signals can have a common magnitude characteristic.

In Example 6, the subject matter of any one or more of Examples 4-5 can include determining the physical stress indicator, including: summing information about the magnitudes of the first and second voltage signals to provide a voltage sum, and using the voltage sum and information about the magnitudes of the first and second current signals, determining a resistance characteristic of a portion of the Hall plate, and determining the physical stress indicator (e.g., including information about a magnitude of physical stress on the Hall plate) using the determined resistance characteristic.

In Example 7, the subject matter of any one or more of Examples 2-6 can include measuring the first electric signal including measuring a first current signal, and the first stimulus can include a first voltage signal, and measuring the second electric signal can include measuring a second current signal, and the second stimulus can include a second voltage signal.

In Example 8, the subject matter of Example 7 can include providing the first and second voltage signals at respective different times.

In Example 9, the subject matter of any one or more of Examples 1-8 can include measuring the first and second electric signals including measuring information about the same off-diagonal charge carrier mobility components of the Hall plate.

In Example 10, the subject matter of any one or more of Examples 1-9 can include providing a correction signal corresponding to the magnitude or direction of stress indicated by the physical stress indicator.

In Example 11, the subject matter of any one or more of Examples 1-10 can include determining an absolute resistance characteristic of the Hall plate, and determining an off-diagonal resistance characteristic of the Hall plate based on the measured first and second electric signals, and providing a temperature compensation signal based on a ratio of the off-diagonal resistance characteristic to the absolute resistance characteristic of the Hall plate.

Example 12 is a stress sensor comprising: a semiconductor device including a Hall plate having first and second pairs of signal nodes, and an excitation circuit configured to provide an excitation signal to the Hall plate using the first or second pair of nodes, and a processor circuit configured to: receive information about a first electric signal, measured at the first pair of signal nodes and responsive to a first portion of the excitation signal, the first electric signal indicative of a charge carrier mobility characteristic of the semiconductor device in a first direction, and receiving information about a second electric signal, measured at the second pair of signal nodes and responsive to a second portion of the excitation signal, the second electric signal indicative of the charge carrier mobility characteristic of the semiconductor device in the same first direction. Example 12 can include or use the processor circuit to determine a physical stress indicator about the semiconductor device based on a relationship between the first and second electric signals.

In Example 13, the subject matter of Example 12 can include the Hall plate being symmetrical about a first axis that extends between the first pair of nodes and is symmetrical about a second axis that extends between the second pair of nodes, and the first axis is orthogonal to the second axis.

In Example 14, the subject matter of any one or more of Examples 12-13 can include the excitation circuit configured to provide the first and second portions of the excitation signal at respective different times.

In Example 15, the subject matter of Example 14 can include the excitation circuit configured to provide the first portion of the excitation signal at the second pair of nodes, and the excitation circuit configured to provide the second portion of the excitation signal at the first pair of nodes.

In Example 16, the subject matter of Example 15 can include a multiplexer circuit configured to couple the excitation circuit to the Hall plate nodes.

In Example 17, the subject matter of any one or more of Examples 12-16 can include the processor circuit configured to: sum voltage magnitude information about the first and second electric signals to provide a voltage sum, and using the voltage sum and information about the magnitude of the excitation signal, determine a resistance characteristic of a portion of the Hall plate, and determine the physical stress indicator (e.g., including information about a magnitude of physical stress on the Hall plate) using the determined resistance characteristic.

In Example 18, the subject matter of any one or more of Examples 12-17 can include the processor circuit configured to provide a package stress compensation signal corresponding to a magnitude or direction of the stress indicated by the physical stress indicator.

Example 19 is a non-transitory processor-readable medium comprising instructions that, when executed, cause a processor circuit to: control an excitation circuit to provide time-multiplexed first and second current signals to respective nodes of a Hall plate, and measure first and second voltage signals, responsive to the first and second current signals, from the nodes of the Hall plate, and determine off-diagonal charge carrier mobility characteristics of the Hall plate using the measured first and second voltage signals together, and provide a physical stress indicator about a magnitude and direction of physical stress on the Hall plate.

In Example 19, the subject matter of Example 19 can include instructions to cause the processor circuit to generate a stress compensation signal based on the physical stress indicator.

Example 21 is a method comprising: providing an excitation signal to an emitter of a first bipolar transistor device, the transistor device comprising first and different second collectors coupled to a base region of the transistor device. In Example 21, the method can include, responsive to the excitation signal, measuring a first collector current from the first collector of the transistor device, and responsive to the excitation signal, measuring a second collector current from the second collector of the transistor device, and determining a magnitude difference between the first and second collector currents. The magnitude difference can correspond to a carrier mobility characteristic of the base region of the transistor device, and the method can further include determining a physical stress indicator about the transistor device based on the magnitude difference between the first and second collector currents.

In Example 22, the subject matter of Example 21 can include concurrently measuring the first and second collector currents in response to the same excitation signal.

In Example 23, the subject matter of Example 22 can include measuring the first and second collector currents including measuring the carrier mobility characteristic for a first current flow direction across the base region of the transistor.

In Example 24, the subject matter of any one or more of Examples 21-21 can include using information about a base-emitter voltage (Vbe or VBE) of the transistor device to provide a voltage reference signal.

In Example 25, the subject matter of any one or more of Examples 21-24 can include determining the physical stress indicator including determining a current deflection characteristic in the base region of the transistor device, the current deflection characteristic corresponding to a physical stress on a semiconductor comprising the transistor device.

In Example 26, the subject matter of any one or more of Examples 21-25 can include measuring the first and second collector currents including sensing base-emitter voltage information from a first side of the transistor device corresponding to the first collector and sensing base-emitter voltage information from a second side of the transistor device corresponding to the second collector, the voltage information indicative of a carrier mobility tensor that describes deformation of the transistor device under stress.

In Example 27, the subject matter of any one or more of Examples 21-26 can include providing a reference voltage or current signal using a bandgap reference generator circuit that comprises the transistor device.

In Example 28, the subject matter of Example 27 can include providing a signal indicative of the physical stress indicator in a time-multiplexed manner with the reference voltage or current signal.

In Example 29, the subject matter of any one or more of Examples 27-28 can include providing a signal indicative of the physical stress indicator concurrently with the reference voltage or current signal.

In Example 30, the subject matter of any one or more of Examples 21-29 can include providing a reference voltage or current signal using a bandgap-type reference generator circuit that comprises a substrate in common with (e.g., shared at least in part with) a substrate of the transistor device.

Example 31 is a semiconductor stress sensor comprising: a bipolar transistor device comprising first and second collector terminals, and an excitation circuit configured to provide an excitation signal to a base-emitter junction of the bipolar transistor device, and a processor circuit configured to: receive information about a first collector signal measured at the first collector terminal, the first collector signal responsive to the excitation signal, and the first collector signal indicative of a carrier mobility characteristic of the bipolar transistor device in a first direction, and receive information about a second collector signal measured at the second collector terminal, the second collector signal responsive to the excitation signal, and the second collector signal indicative of the carrier mobility characteristic of the semiconductor device in the same first direction, and determine a physical stress indicator about the semiconductor device based on a relationship between the first and second collector signals.

In Example 32, the subject matter of Example 31 can include the first and second collector signals indicate a carrier mobility characteristic in a base region of the bipolar transistor device.

In Example 31, the subject matter of any one or more of Examples 31-32 can include an emitter region, base region, and collector region of the bipolar transistor device layered in a second direction that is orthogonal to the first direction.

In Example 34, the subject matter of any one or more of Examples 31-31 can include the processor circuit configured to receive the information about the first and second collector signals in response to the same excitation signal.

In Example 35, the subject matter of any one or more of Examples 31-34 can include determining the physical stress indicator including determining a current signal magnitude difference between the first and second collector signals.

In Example 36, the subject matter of Example 35 can include the magnitude difference between the first and second collector signals corresponds to a charge flow deflection in a base region of the bipolar transistor device.

In Example 37, the subject matter of any one or more of Examples 31-36 can include a reference signal generator circuit comprising multiple other transistors, and the multiple other transistors and the bipolar transistor device comprise at least a portion of a shared substrate.

In Example 38, the subject matter of any one or more of Examples 31-37 can include the bipolar transistor device comprising a portion of a reference signal generator circuit, and the reference signal generator circuit can be configured to provide a reference signal using information about a base-emitter voltage (Vbe) of the bipolar transistor device.

In Example 39, the subject matter of any one or more of Examples 31-38 can include the first and second collector terminals provided at opposite sides of the emitter terminal of the bipolar transistor device.

In Example 40, the subject matter of any one or more of Examples 31-39 can include a surface of the bipolar transistor device including the emitter terminal surrounded by a base terminal, and the first and second collector terminals are separated from the emitter terminal by the base terminal, and the first and second collector terminals are electrically decoupled at the surface.

Example 41 is a reference signal generator circuit comprising: a first bandgap reference generator circuit comprising a first portion of a semiconductor assembly and configured to provide an uncorrected reference voltage signal, and a bipolar transistor device comprising first and second collector terminals, the bipolar transistor device having a shared substrate with the first portion of the semiconductor assembly, and an excitation circuit configured to provide an excitation signal to an emitter terminal of the bipolar transistor device. Example 41 can include a processor circuit configured to: receive information about a first collector signal measured at the first collector terminal, the first collector signal responsive to the excitation signal, and the first collector signal indicative of a carrier mobility characteristic of the bipolar transistor device in a first direction, and receive information about a second collector signal measured at the second collector terminal, the second collector signal responsive to the excitation signal, and the second collector signal indicative of the carrier mobility characteristic of the semiconductor device in the same first direction, and determine a physical stress indicator about the semiconductor device based on a relationship between the first and second collector signals, and provide a corrected voltage reference signal based on the uncorrected reference voltage signal and the physical stress indicator.

In Example 42, the subject matter of Example 41 can include the processor circuit configured to determine the physical stress indicator based on a current magnitude difference between the first and second collector signals.

In Example 41, the subject matter of any one or more of Examples 41-42 can include the first and second collector signals indicate a carrier mobility characteristic in a base region of the bipolar transistor device, wherein the carrier mobility characteristic is subject to change depending on a mechanical stress applied to the semiconductor assembly.

In Example 44, the subject matter of any one or more of Examples 41-41 can include the uncorrected reference voltage signal is based on a base-emitter voltage characteristic of the bipolar transistor device.

Example 45 is at least one machine-readable medium including instructions that, when executed by processing circuitry, cause the processing circuitry to perform operations to implement of any of any one or more of Examples 1-44.

Example 46 is an apparatus comprising means to implement of any of any one or more of Examples 1-44.

Example 47 is a system to implement of any of any one or more of Examples 1-44.

Example 48 is a method to implement of any of any one or more of Examples 1-44.

Each of these non-limiting Examples can stand on its own, or can be combined in various permutations or combinations with one or more of the other examples or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods or circuit operations or circuit configuration instructions as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method comprising:
   providing an excitation signal to an emitter of a first bipolar transistor device, the transistor device comprising first and different second collectors coupled to a base region of the transistor device;
   responsive to the excitation signal, measuring a first collector current from the first collector of the transistor device;
   responsive to the excitation signal, measuring a second collector current from the second collector of the transistor device;
   determining a magnitude difference between the first and second collector currents, wherein the magnitude difference corresponds to a carrier mobility characteristic of the base region of the transistor device; and
   determining a physical stress indicator about the transistor device based on the magnitude difference between the first and second collector currents.

2. The method of claim 1, comprising concurrently measuring the first and second collector currents in response to the same excitation signal.

3. The method of claim 2, wherein measuring the first and second collector currents includes measuring the carrier mobility characteristic for a first current flow direction across the base region of the transistor.

4. The method of claim 1, comprising using information about a base-emitter voltage (Vbe) of the transistor device to provide a voltage reference signal.

5. The method of claim 1, wherein determining the physical stress indicator includes determining a current deflection characteristic in the base region of the transistor device, the current deflection characteristic corresponding to a physical stress on a semiconductor comprising the transistor device.

6. The method of claim 1, wherein measuring the first and second collector currents includes sensing base-emitter voltage information from a first side of the transistor device corresponding to the first collector and sensing base-emitter voltage information from a second side of the transistor device corresponding to the second collector, the voltage information indicative of a carrier mobility tensor that describes deformation of the transistor device under stress.

7. The method of claim 1, further comprising providing a reference voltage or current signal using a bandgap reference generator circuit that comprises the transistor device.

8. The method of claim 7, further comprising providing a signal indicative of the physical stress indicator in a time-multiplexed manner with the reference voltage or current signal.

9. The method of claim 7, further comprising providing a signal indicative of the physical stress indicator concurrently with the reference voltage or current signal.

10. The method of claim 1, further comprising providing a reference voltage or current signal using a bandgap-type reference generator circuit that comprises a substrate in common with a substrate of the transistor device.

11. A semiconductor stress sensor comprising:
    a bipolar transistor device comprising first and second collector terminals;
    an excitation circuit configured to provide an excitation signal to a base-emitter junction of the bipolar transistor device; and
    a processor circuit configured to:
      receive information about a first collector signal measured at the first collector terminal, the first collector signal responsive to the excitation signal, and the first collector signal indicative of a carrier mobility characteristic of the bipolar transistor device in a first direction;
      receive information about a second collector signal measured at the second collector terminal, the second collector signal responsive to the excitation signal, and the second collector signal indicative of the carrier mobility characteristic of the bipolar transistor device in the same first direction; and
      determine a physical stress indicator about the bipolar transistor device based on a relationship between the first and second collector signals.

12. The semiconductor stress sensor of claim 11, wherein the first and second collector signals indicate a carrier mobility characteristic in a base region of the bipolar transistor device.

13. The semiconductor stress sensor of claim 11, wherein an emitter region, base region, and collector region of the bipolar transistor device are layered in a second direction that is orthogonal to the first direction.

14. The semiconductor stress sensor of claim 11, wherein the processor circuit is configured to receive the information about the first and second collector signals in response to the same excitation signal.

15. The semiconductor stress sensor of claim 11, wherein determining the physical stress indicator includes determining a current signal magnitude difference between the first and second collector signals, and the magnitude difference between the first and second collector signals corresponds to a charge flow deflection in a base region of the bipolar transistor device.

16. The semiconductor stress sensor of claim 11, further comprising a reference signal generator circuit comprising multiple other transistors, wherein the multiple other transistors and the bipolar transistor device comprise a shared substrate.

17. The semiconductor stress sensor of claim 11, wherein the bipolar transistor device comprises a portion of a reference signal generator circuit, and wherein the reference signal generator circuit is configured to provide a reference signal using information about a base-emitter voltage (Vbe) of the bipolar transistor device.

18. The semiconductor stress sensor of claim 11, wherein a surface of the bipolar transistor device includes the emitter terminal surrounded by a base terminal, and wherein the first and second collector terminals are separated from the emitter terminal by the base terminal, and the first and second collector terminals are electrically decoupled at the surface.

19. A reference signal generator circuit comprising:
a first bandgap reference generator circuit comprising a first portion of a semiconductor assembly and configured to provide an uncorrected reference voltage signal;
a bipolar transistor device comprising first and second collector terminals, the bipolar transistor device having a shared substrate with the first portion of the semiconductor assembly;
an excitation circuit configured to provide an excitation signal to an emitter terminal of the bipolar transistor device; and
a processor circuit configured to:
receive information about a first collector signal measured at the first collector terminal, the first collector signal responsive to the excitation signal, and the first collector signal indicative of a carrier mobility characteristic of the bipolar transistor device in a first direction;
receive information about a second collector signal measured at the second collector terminal, the second collector signal responsive to the excitation signal, and the second collector signal indicative of the carrier mobility characteristic of the bipolar transistor device in the same first direction;
determine a physical stress indicator about the bipolar transistor device based on a relationship between the first and second collector signals; and
provide a corrected voltage reference signal based on the uncorrected reference voltage signal and the physical stress indicator.

20. The reference signal generator circuit of claim 19, wherein the processor circuit is configured to determine the physical stress indicator based on a current magnitude difference between the first and second collector signals.

21. The reference signal generator circuit of claim 19, wherein the uncorrected reference voltage signal is based on a base-emitter voltage characteristic of the bipolar transistor device.

* * * * *